(12) United States Patent
Yoneda et al.

(10) Patent No.: US 11,302,736 B2
(45) Date of Patent: Apr. 12, 2022

(54) IMAGING DEVICE AND ELECTRONIC DEVICE

(71) Applicant: Semiconductor Energy Laboratory Co., Ltd., Atsugi (JP)

(72) Inventors: Seiichi Yoneda, Isehara (JP); Yusuke Negoro, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 7 days.

(21) Appl. No.: 16/940,458

(22) Filed: Jul. 28, 2020

(65) Prior Publication Data
US 2021/0043671 A1     Feb. 11, 2021

(30) Foreign Application Priority Data

Aug. 8, 2019 (JP) .............................. JP2019-146340

(51) Int. Cl.
| | | |
|---|---|---|
| *H01L 29/10* | (2006.01) | |
| *H01L 27/146* | (2006.01) | |
| *H01L 23/00* | (2006.01) | |

(52) U.S. Cl.
CPC ........ *H01L 27/14634* (2013.01); *H01L 24/08* (2013.01); *H01L 24/32* (2013.01); *H01L 27/14603* (2013.01); *H01L 27/14636* (2013.01); *H01L 2224/08145* (2013.01); *H01L 2224/32145* (2013.01)

(58) Field of Classification Search
None
See application file for complete search history.

(56) References Cited

U.S. PATENT DOCUMENTS

| | | | |
|---|---|---|---|
| 8,957,358 B2* | 2/2015 | Wan | H01L 27/1469 250/208.1 |
| 9,911,870 B2* | 3/2018 | Sato | H01L 31/02005 |
| 10,074,678 B2 | 9/2018 | Kato et al. | |
| 10,186,533 B2 | 1/2019 | Kato et al. | |
| 10,586,818 B2 | 3/2020 | Kato et al. | |
| 2013/0049082 A1 | 2/2013 | Kato et al. | |
| 2015/0054110 A1* | 2/2015 | Kashihara | H01L 27/14643 257/435 |
| 2016/0372504 A1 | 12/2016 | Kato et al. | |
| 2019/0115379 A1 | 4/2019 | Kato et al. | |

FOREIGN PATENT DOCUMENTS

JP          2013-062789 A    4/2013

* cited by examiner

*Primary Examiner* — Hung K Vu
(74) *Attorney, Agent, or Firm* — Robinson Intellectual Property Law Office; Eric J. Robinson

(57) ABSTRACT

An imaging device includes a first semiconductor substrate and a second semiconductor substrate. The first semiconductor substrate includes a photoelectric conversion device and a first transistor. The second semiconductor substrate includes a second transistor, a third transistor, and a fourth transistor. One electrode of the photoelectric conversion device is electrically connected to one of a source and a drain of the first transistor. The other of the source and the drain of the first transistor is electrically connected to one of a source and a drain of the second transistor and a gate of the third transistor. One of a source and a drain of the third transistor is electrically connected to one of a source and a drain of the fourth transistor. The photoelectric conversion device and at least parts of the second transistor, the third transistor, and the fourth transistor overlap with each other.

9 Claims, 15 Drawing Sheets

FIG. 3A

| | | | | | | |
|---|---|---|---|---|---|---|
| Line[1] | Rn-1 | En | | Rn | En+1 | |
| Line[2] | En-1 | Rn-1 | En | Rn | En+1 | |
| Line[3] | En-1 | Rn-1 | En | Rn | | En+1 |
| ⋮ | | | | | | |
| Line[M] | En-1 | | Rn-1 | En | | Rn |

FIG. 3B

| | | | | |
|---|---|---|---|---|
| Line[1] | En | Rn | | En+1 |
| Line[2] | En | Rn | | En+1 |
| Line[3] | En | Rn | | En+1 |
| ⋮ | | | | |
| Line[M] | En | | Rn | En+1 |

FIG. 14A1
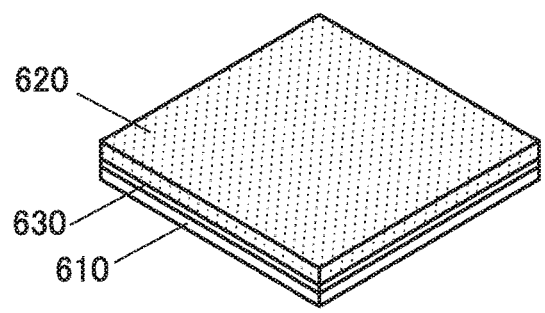
FIG. 14B1
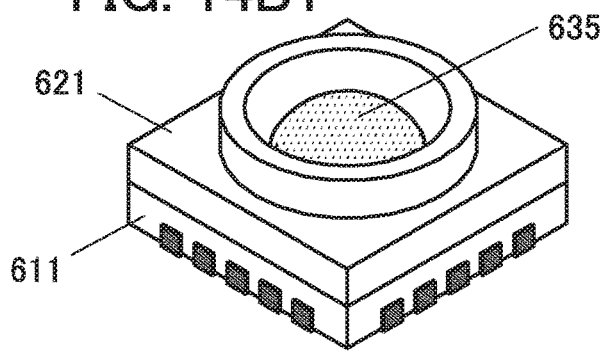
FIG. 14A2
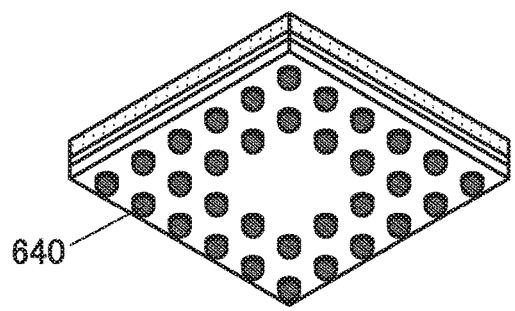
FIG. 14B2
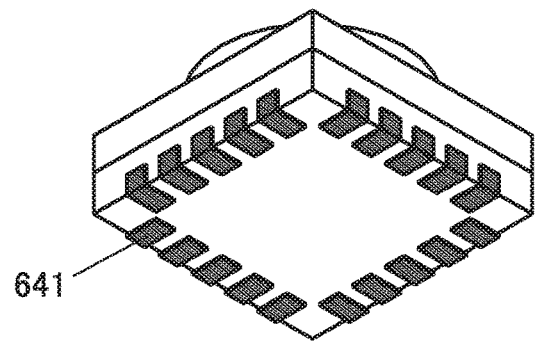
FIG. 14A3
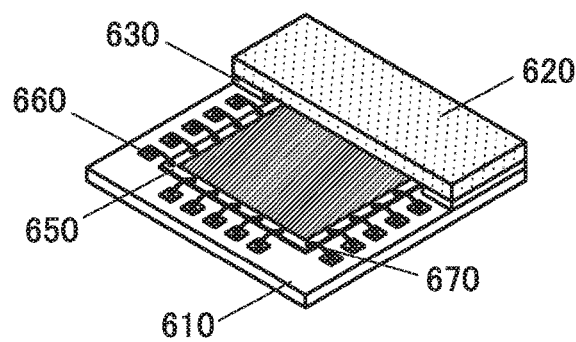
FIG. 14B3
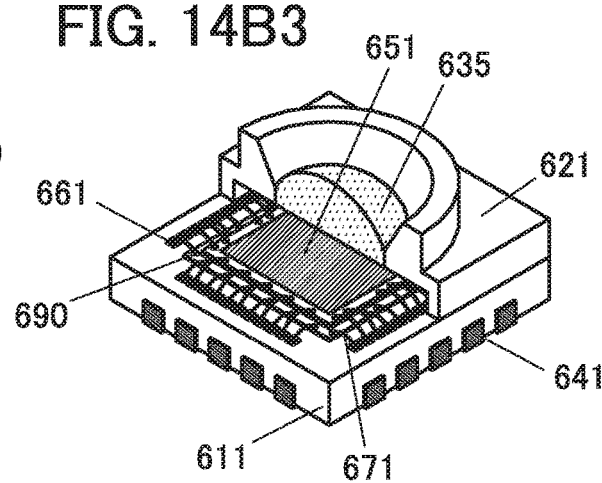

IMAGING DEVICE AND ELECTRONIC DEVICE

BACKGROUND OF THE INVENTION

1. Field of the Invention

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

An imaging device typified by a CMOS image sensor is used in various kinds of image and video devices, such as a digital still camera, a video camera, and a smartphone. While the Internet of Things (IOT) is popular in a society, the imaging device is used in a variety of fields in, for example, a surveillance camera, a sensor for a vehicle, medical equipment, and a sensor for a robot.

The pixel size has been miniaturized in accordance with an increase in resolution of the imaging device. The area occupied by a photodiode has been reduced in accordance with the miniaturization of the pixel size. This might cause the imaging device to have insufficient sensitivity and an insufficient dynamic range.

For example, a CMOS image sensor is disclosed in which part of a pixel circuit is shared by a plurality of pixels so that an area occupied by elements other than a photodiode is reduced and accordingly, an area occupied by the photodiode is increased (see Patent Document 1).

REFERENCE

Patent Document

[Patent Document 1] Japanese Published Patent Application No. 2013-062789

SUMMARY OF THE INVENTION

One object of one embodiment of the present invention is to provide an imaging device having high sensitivity. Another object of one embodiment of the present invention is to provide an imaging device having high resolution. Another object of one embodiment of the present invention is to provide a high-performance imaging device. Another object of one embodiment of the present invention is to provide a small imaging device. Another object of one embodiment of the present invention is to provide an imaging device capable of high-speed operation. Another object of one embodiment of the present invention is to provide a novel imaging device. Another object of one embodiment of the present invention is to provide a driving method of the imaging device. Another object of one embodiment of the present invention is to provide a novel electronic device and the like.

Note that the description of these objects does not preclude the existence of other objects. One embodiment of the present invention does not have to achieve all these objects. Other objects are apparent from and can be derived from the description of the specification, the drawings, the claims, and the like.

One embodiment of the present invention is an imaging device including a first semiconductor substrate and a second semiconductor substrate. The first semiconductor substrate includes a photoelectric conversion device and a first transistor. The second semiconductor substrate includes a second transistor, a third transistor, and a fourth transistor. One electrode of the photoelectric conversion device is electrically connected to one of a source and a drain of the first transistor. The other of the source and the drain of the first transistor is electrically connected to one of a source and a drain of the second transistor. The one of the source and the drain of the second transistor is electrically connected to a gate of the third transistor. One of a source and a drain of the third transistor is electrically connected to one of a source and a drain of the fourth transistor. The photoelectric conversion device and at least parts of the second transistor, the third transistor, and the fourth transistor overlap with each other.

In the above embodiment, it is preferable that a first insulating layer and a first conductive layer be positioned at a side of a surface of the first semiconductor substrate where the first transistor is formed, the first conductive layer include a region embedded in the first insulating layer and be electrically connected to the other of the source and the drain of the first transistor, a second insulating layer and a second conductive layer be positioned at a side of a surface of the second semiconductor substrate where the second to fourth transistors are formed, the second conductive layer include a region embedded in the second insulating layer and be electrically connected to the gate of the third transistor, the first conductive layer and the second conductive layer be directly bonded to each other, and the first insulating layer and the second insulating layer be directly bonded to each other.

In the above embodiment, it is preferable that the first semiconductor substrate and the second semiconductor substrate be silicon substrates. Furthermore, it is preferable that the first semiconductor substrate include an element imparting p-type conductivity, and regions functioning as the one electrode of the photoelectric conversion device and the source and the drain of the first transistor include elements imparting n-type conductivity. Moreover, it is preferable that the one electrode of the photoelectric conversion device and the one of the source and the drain of the first transistor be formed in the same region.

In the above embodiment, it is preferable that a first capacitor be positioned between the second semiconductor substrate and the second insulating layer, and one electrode of the first capacitor be electrically connected to the gate of the third transistor.

In the above embodiment, it is preferable that a third semiconductor substrate be positioned at a side of a surface of the second semiconductor substrate where the second to fourth transistors are not formed, a fifth transistor be formed on the third semiconductor substrate, and the fifth transistor be electrically connected to the other of the source and the drain of the fourth transistor through a second capacitor.

In the above embodiment, it is preferable that a memory circuit be positioned between the second semiconductor substrate and the third semiconductor substrate, and the memory circuit include a transistor including a metal oxide in a channel formation region.

In the above embodiment, it is preferable that the metal oxide include In, Zn, and M (M is one or more of Al, Ti, Ga, Ge, Sn, Y, Zr, La, Ce, Nd, and Hf).

Another embodiment of the present invention is an electronic device including the imaging device described in the above embodiment and a display device.

According to one embodiment of the present invention, an imaging device having high sensitivity can be provided. Alternatively, according to one embodiment of the present invention, an imaging device having high resolution can be provided. Alternatively, according to one embodiment of the present invention, a high-performance imaging device can be provided. Alternatively, according to one embodiment of the present invention, a small imaging device can be provided. Alternatively, according to one embodiment of the present invention, an imaging device capable of high-speed operation can be provided. Alternatively, according to one embodiment of the present invention, a novel imaging device and the like can be provided. Alternatively, according to one embodiment of the present invention, a driving method of the imaging device can be provided. Alternatively, according to one embodiment of the present invention, a novel electronic device and the like can be provided.

BRIEF DESCRIPTION OF THE DRAWINGS

FIGS. 3A and 3B each illustrate operation of an imaging device of one embodiment of the present invention.

FIGS. 14A1, 14A2, and 14A3 are perspective views of a package including an imaging device of one embodiment of the present invention, and FIGS. 14B1, 14B2, and 14B3 are perspective views of a module including an imaging device of one embodiment of the present invention.

DETAILED DESCRIPTION OF THE INVENTION

Figure 1A:
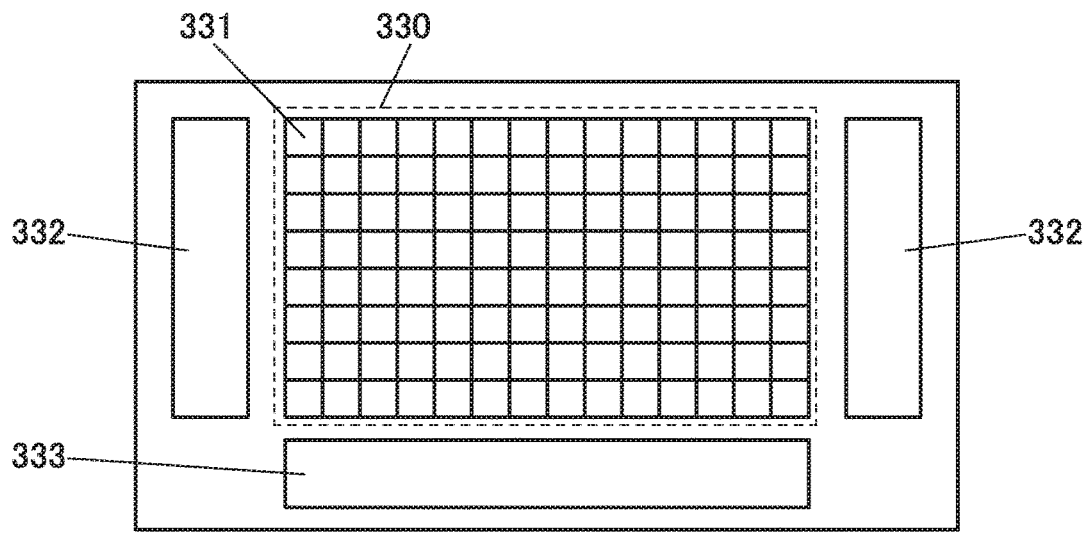
FIG. 1A is a block diagram of an imaging device of one embodiment of the present invention.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where elements are illustrated in a circuit diagram as if they were directly connected to each other, the elements may actually be connected to each other through one conductor or a plurality of conductors. In this specification, even such a configuration is included in direct connection.

Embodiment 1

In this embodiment, an imaging device of one embodiment of the present invention is described with reference to FIGS. 1A and 1B, FIG. 2, FIGS. 3A and 3B, FIG. 4, FIG. 5, FIG. 6, FIGS. 7A to 7C, FIG. 8, FIG. 9, FIGS. 10A and 10B, FIGS. 11A to 11E, FIG. 12, and FIGS. 13A to 13D.

One embodiment of the present invention is an imaging device including a pixel circuit including elements formed in two semiconductor substrates. Here, the pixel circuit includes at least a photoelectric conversion device and a plurality of transistors. The photoelectric conversion device and some of the transistors are formed in the first semiconductor substrate, and most of the transistors are formed in the second semiconductor substrate. Therefore, the number of transistors formed in the first semiconductor substrate can be reduced by the number of transistors formed in the second semiconductor substrate, which enables the area occupied by the photoelectric conversion device to be increased. Accordingly, even in the case where the size of the pixel is reduced, the proportion of the area occupied by the photoelectric conversion device in each pixel can be increased, so that an imaging device having high resolution and high sensitivity can be provided.

For example, in an imaging device including a pixel having four transistors, a photoelectric conversion device, a transfer transistor, a reset transistor, a source follower transistor, and a selection transistor are formed in the pixel circuit. In this case, the photoelectric conversion device and the transfer transistor are provided in the first semiconductor substrate, and the reset transistor, the source follower transistor, and the selection transistor are provided in the second semiconductor substrate. With such a structure, for each pixel, the area occupied by the photoelectric conversion device can be increased by the area of the three transistors provided in the second semiconductor substrate.

<Configuration 1 of Imaging Device>

FIG. 1A is a block diagram of an imaging device of one embodiment of the present invention. The imaging device includes a pixel portion 330, a driver circuit 332, and a driver circuit 333.

The pixel portion 330 includes a plurality of pixel circuits 331 arranged in a matrix. The pixel circuit 331 includes a photoelectric conversion device and a plurality of transistors. Here, the photoelectric conversion device preferably has sensitivity with respect to visible light. For example, a photodiode including silicon in a photoelectric conversion layer can be used as the photoelectric conversion device.

The driver circuit 332 can control data acquisition operation, selection operation, and the like of the pixel circuit 331. For the driver circuit 332, a shift register or the like can be used, for example.

The driver circuit 333 includes a reading circuit electrically connected to the pixel circuit 331, a driver circuit for controlling operation of the reading circuit, and the like. The reading circuit includes a correlated double sampling (CDS) circuit for reducing noise and an A/D converter for converting analog data into digital data.

<Pixel Circuit>

Figure 1B:
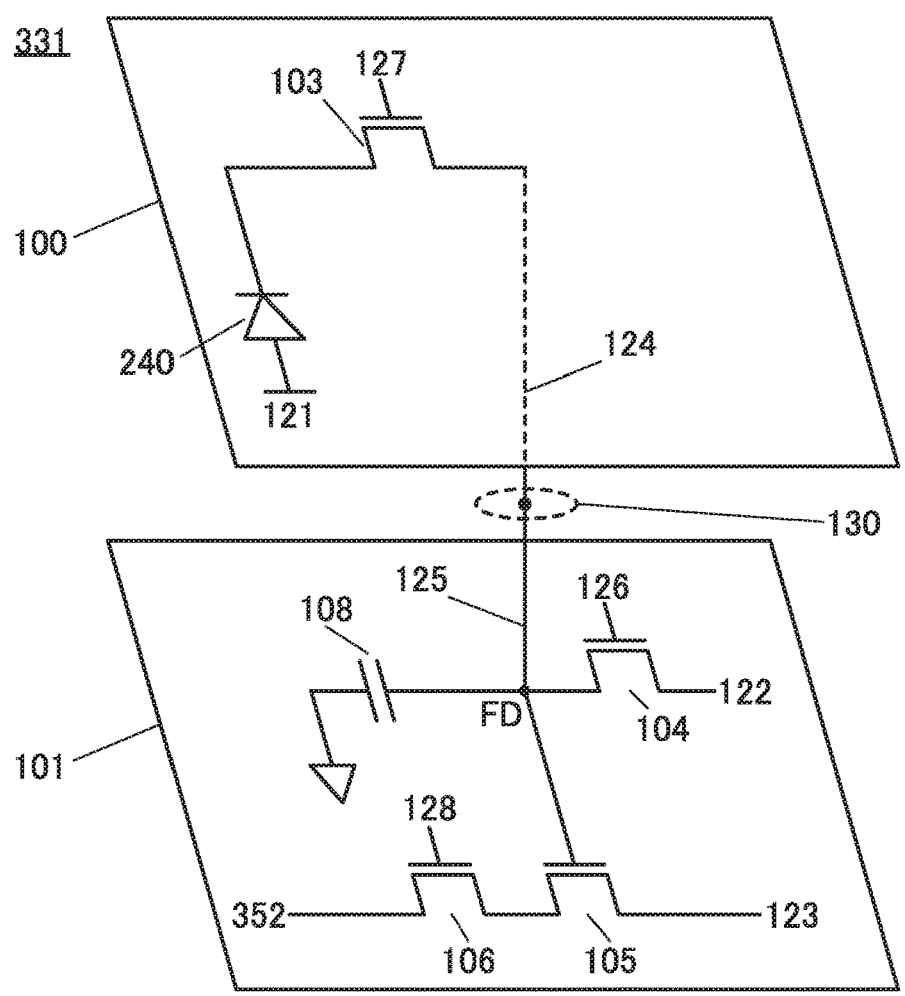
FIG. 1B is a circuit diagram of a pixel circuit.

FIG. 1B is a circuit diagram illustrating an example of the pixel circuit 331. The pixel circuit 331 can include a photoelectric conversion device 240, a transistor 103, a transistor 104, a transistor 105, a transistor 106, and a capacitor 108. The pixel circuit 331 includes an element layer 100 and an element layer 101 provided below the element layer 100, and the element layer 100 and the element layer 101 are formed in different semiconductor substrates. The photoelectric conversion device 240 and the transistor 103 are formed in the element layer 100, and the transistor 104, the transistor 105, the transistor 106, and the capacitor 108 are formed in the element layer 101. Note that the capacitor 108 is not necessarily provided.

Each of the transistors is assumed to be an n-channel transistor in the following description. Note that a term, a reference numeral, or the like may be replaced with an appropriate one when a p-channel transistor is used.

Note that the photoelectric conversion device 240 preferably has sensitivity in a visible light region. For example, a photodiode that uses silicon in a photoelectric conversion layer can be used for the photoelectric conversion device 240.

One electrode (cathode) of the photoelectric conversion device 240 is electrically connected to one of a source and a drain of the transistor 103. The other of the source and the drain the transistor 103 is electrically connected to one of a source and a drain of the transistor 104. The one of the source and the drain of the transistor 104 is electrically connected to a gate of the transistor 105. One of a source and a drain of the transistor 105 is electrically connected to one of a source and a drain of the transistor 106. One electrode of the capacitor 108 is electrically connected to the gate of the transistor 105.

Furthermore, the other of the source and the drain of the transistor 103 is electrically connected to a wiring 124, and the gate of the transistor 105 is electrically connected to a wiring 125. The wiring 124 and the wiring 125 are connected to each other by a bonding portion 130 between the element layer 100 and the element layer 101. In this manner, the other of the source and the drain of the transistor 103 in the element layer 100 is electrically connected to the one of the source and the drain of the transistor 104 and the gate of the transistor 105 in the element layer 101.

Here, a node where the other of the source and the drain of the transistor 103, the wiring 124, the bonding portion 130, the wiring 125, the one of the source and the drain of the transistor 104, the one electrode of the capacitor 108, and the gate of the transistor 105 are connected is referred to as a node FD. The node FD can function as a charge detection portion.

The other electrode (anode) of the photoelectric conversion device 240 is electrically connected to a wiring 121. A gate of the transistor 103 is electrically connected to a wiring 127. The other of the source and the drain of the transistor 104 is electrically connected to a wiring 122. The other of the source and the drain of the transistor 105 is electrically connected to a wiring 123. A gate of the transistor 104 is electrically connected to a wiring 126. A gate of the transistor 106 is electrically connected to a wiring 128. The other electrode of the capacitor 108 is electrically connected to a reference potential line such as a GND wiring, for example. The other of the source and the drain of the transistor 106 is electrically connected to a wiring 352.

The wirings 126, 127, and 128 can function as signal lines that control the conduction of the respective transistors. The wiring 352 can function as an output line.

The wirings 121, 122, and 123 can function as power supply lines. The structure illustrated in FIG. 1B is a structure in which the cathode of the photoelectric conversion device 240 is electrically connected to the transistor 103 and the node FD is reset to a high potential; accordingly, the wiring 122 is set to a high potential (a potential higher than that of the wiring 121).

The transistor 103 has a function of controlling the potential of the node FD, and thus can be referred to as a transfer transistor. The transistor 104 has a function of resetting the potential of the node FD, and thus can be referred to as a reset transistor. The transistor 105 functions as a component of a source follower circuit and can output the potential of the node FD as image data to the wiring 352, and thus can be referred to as a source follower transistor. The transistor 106 has a function of selecting a pixel to which image data is output, and thus can be referred to as a selection transistor.

Here, it is preferable that the photoelectric conversion device 240 and at least parts of the transistor 104, the transistor 105, and the transistor 106 overlap with each other. For example, the photoelectric conversion device 240 may overlap with part of the transistor 104 and part of the transistor 105. For example, the photoelectric conversion device 240 may overlap with part of the transistor 104 and part of the transistor 106. For example, the photoelectric conversion device 240 may overlap with part of the transistor 105 and part of the transistor 106. For example, the photoelectric conversion device 240 may overlap with part of the transistor 104. For example, the photoelectric conversion device 240 may overlap with part of the transistor 105. For example, the photoelectric conversion device 240 may overlap with part of the transistor 106. As the area in which the photoelectric conversion device 240 and the transistors 104, 105, and 106 overlap with each other is larger, the area occupied by the photoelectric conversion device 240 in each pixel can be larger. Thus, even in the case of miniaturization of the pixel size, the proportion of the area occupied by the photoelectric conversion device 240 in each pixel can be increased, so that an imaging device having high resolution and high sensitivity can be provided.

Figure 2:
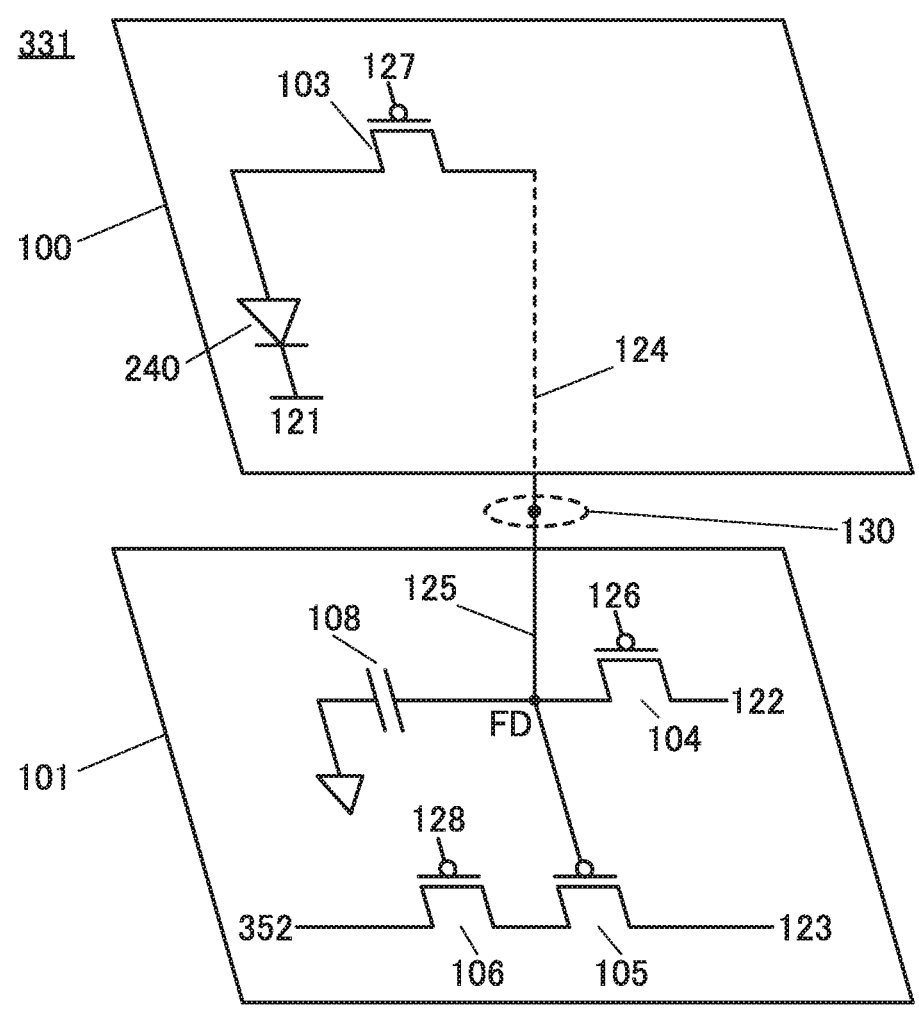
FIG. 2 is a circuit diagram of a pixel circuit of an imaging device of one embodiment of the present invention.

Although the cathode of the photoelectric conversion device 240 is electrically connected to the node FD in FIG. 1B, the anode of the photoelectric conversion device 240 may be electrically connected to the one of the source and the drain of the transistor 103 as illustrated in FIG. 2.

Since the node FD is reset to a low potential in the configuration, the wiring 122 has a low potential (a potential lower than that of the wiring 121). Furthermore, in the circuit illustrated in FIG. 2, at least the transistor 103 is preferably a p-channel transistor, and more preferably, the transistors 103 to 106 are p-channel transistors.

<Operation Method of Imaging Device>

An imaging device of one embodiment of the present invention can be operated with a rolling shutter method or a global shutter method. FIG. 3A is a schematic view of the operation method with a rolling shutter method, and FIG. 3B is a schematic view of a global shutter method. Note that En denotes exposure (accumulation operation) in the n-th column (n is a natural number), and Rn denotes reading operation in the n-th column. FIGS. 3A and 3B show operation from the first row to the M-th row (M is a natural number).

The rolling shutter method shown in FIG. 3A is an operation method in which the exposure and data reading are performed sequentially and a reading period of a row overlaps with an exposure period of another row. The reading operation is performed right after the exposure, so that imaging can be relatively easily performed even with a circuit structure having a relatively short data holding period. Note that in the rolling shutter method, an image of one frame is formed with data that does not have simultaneity of imaging, and thus distortion in an image might occur in imaging of a moving object.

In the global shutter method illustrated in FIG. 3B, exposure is performed on all the pixels simultaneously, data is held in each pixel, and data reading is performed row by row. Thus, an image without distortion can be obtained even when an image of a moving object is captured. Note that since reading operation is performed after data is held in each pixel in the global shutter method, a memory circuit may be separately provided so that data in each pixel is stored.

<Operation of Pixel Circuit>

Figure 4:
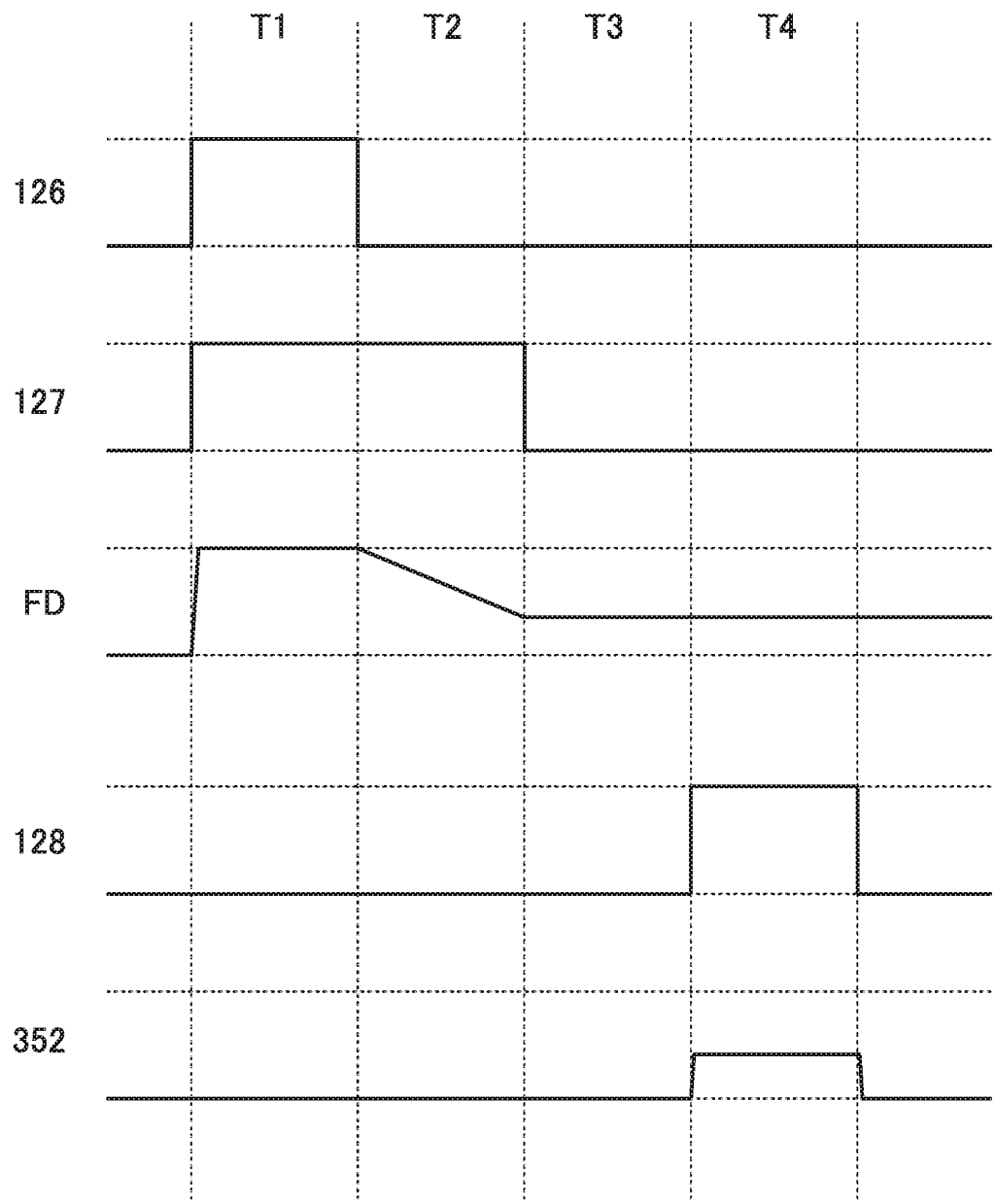
FIG. 4 is a timing chart showing operation of a pixel circuit of one embodiment of the present invention.

Next, an example of the operation of the pixel circuit illustrated in FIG. 1B is described with reference to a timing chart in FIG. 4. Note that in the description of the timing chart in this specification, a high potential is denoted by "H" and a low potential is denoted by "L". The wiring 121 is always supplied with "L", and the wirings 122 and 123 are always supplied with "H".

In Period T1, the potential of the wiring 126 is set to "H", the potential of the wiring 127 is set to "H", and the potential of the wiring 128 is set to "L", whereby the transistors 103 and 104 are turned on. At this time, the potential "H" of the wiring 122 is supplied to the node FD (reset operation).

In Period T2, the potential of the wiring 126 is set to "L", the potential of the wiring 127 is set to "H", and the potential of the wiring 128 is set to "L", whereby the transistor 104 is turned off, and supply of the reset potential is stopped. Furthermore, the potential of the node FD is decreased in accordance with the operation of the photoelectric conversion device 240 (accumulation operation).

In Period T3, the potential of the wiring 126 is set to "L", the potential of the wiring 127 is set to "L", and the potential of the wiring 128 is set to "L", whereby the transistor 103 is turned off, and the potential of the node FD is fixed and held (holding operation). In Period T3, the amount of charge leaked from the node FD depends on the amount of capacitance of the capacitor 108 connected to the node FD, and the like. Thus, the length of the data holding operation period T3 is set in accordance with the capacitance of the capacitor 108, and the like.

In Period T4, the potential of the wiring 126 is set to "L", the potential of the wiring 127 is set to "L", and the potential of the wiring 128 is set to "H", whereby the transistor 106 is turned on, and the potential of the node FD is read out to the wiring 352 by source follower operation of the transistor 105 (reading operation). The above is an example of the operation of the pixel circuit in FIG. 1B.

<Reading Circuit>

Figure 5:
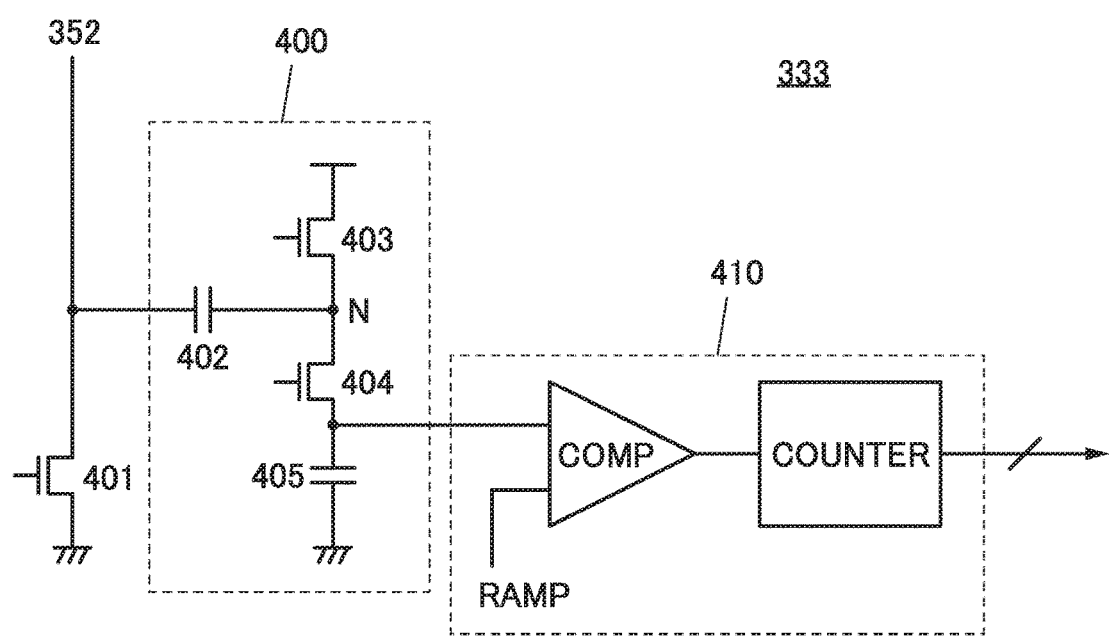
FIG. 5 is a circuit diagram illustrating a reading circuit of one embodiment of the present invention.

FIG. 5 illustrates an example of a reading circuit included in the driver circuit 333 connected to the pixel circuit 331, and shows a circuit diagram of a CDS circuit 400 and a block diagram of an A/D converter 410 that is electrically connected to the CDS circuit 400. Note that the CDS circuit and the A/D converter illustrated in FIG. 5 are examples, and may have another structure.

The CDS circuit 400 can include a capacitor 402 for capacitive coupling, a transistor 403 for supplying a potential $V_0$, a transistor 404 holding a potential supplied to the A/D converter 410, and a capacitor 405 for holding a potential. An input of the CDS circuit 400 is electrically connected to the pixel circuit 331 and a transistor 401 functioning as a current source, and an output of the CDS circuit 400 is electrically connected to a comparator circuit (COMP) of the A/D converter 410.

When the potential of the wiring 352 is $V_{res}$ (the pixel circuit 331 is in a reset state), the potential of a node N (a connection point of the transistors 403 and 404 and the capacitor 402) is set to $V_0$. Then, the node N is made into a floating state, and the potential of the wiring 352 becomes $V_{data}$ (the pixel circuit 331 outputs image data); accordingly, the potential of the node N becomes $V_0+V_{data}-V_{res}$. Therefore, in the CDS circuit 400, the potential in the reset state can be subtracted from the potential of the imaging data output from the pixel circuit 331, so that noise components can be reduced.

The A/D converter 410 can include the comparator circuit (COMP) and a counter circuit (COUNTER). In the A/D converter 410, a signal potential input from the CDS circuit 400 to the comparator circuit (COMP) and a swept reference potential (RAMP) are compared. Then, the counter circuit (COUNTER) is operated in accordance with the output of the comparator circuit (COMP), and a digital signal is output to a plurality of wirings.

<Structure 1 of Imaging Device>

Next, a pixel structure of the imaging device is described with reference to a cross-sectional view.

Figure 6:
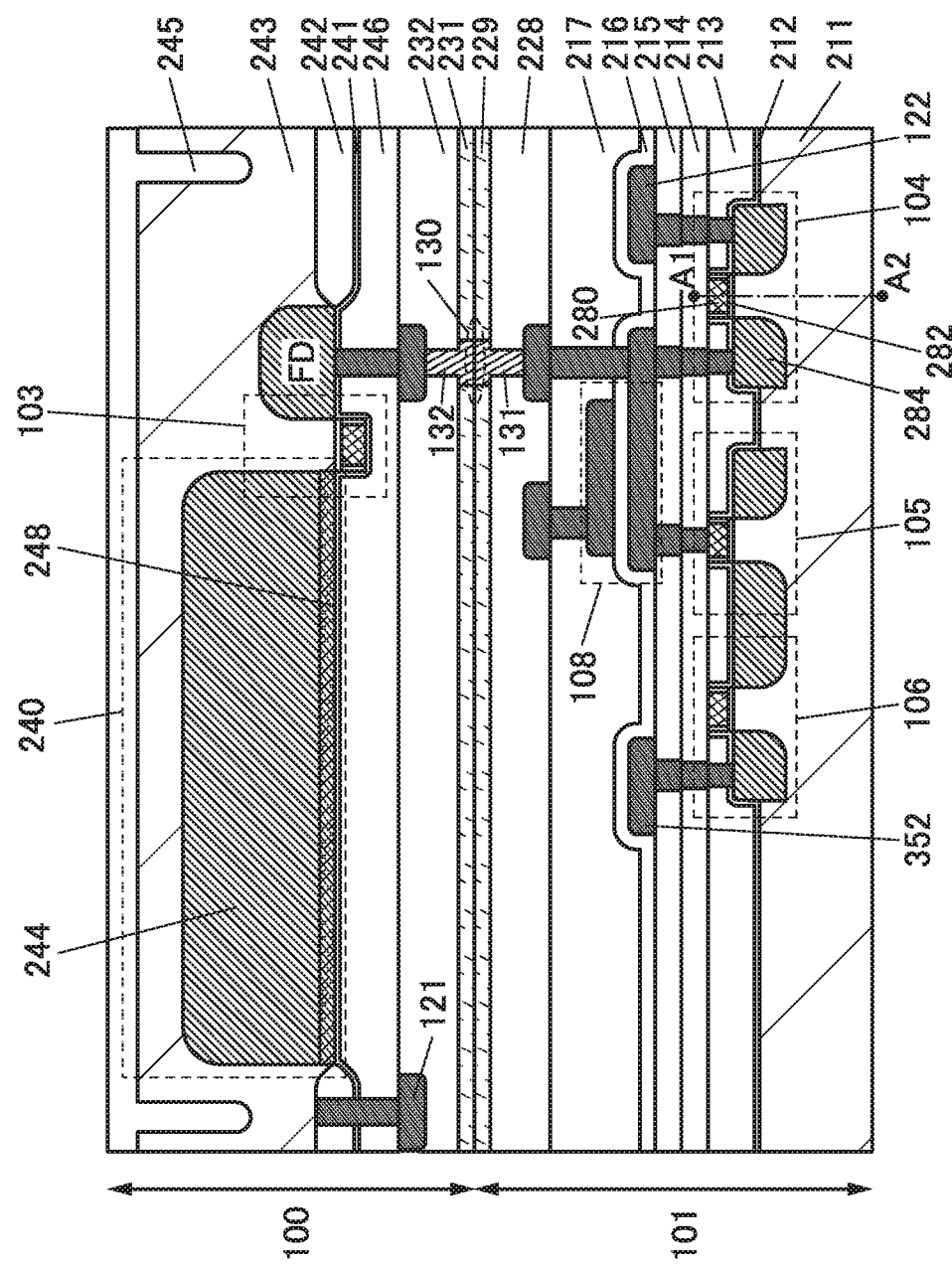
FIG. 6 is a cross-sectional view illustrating a pixel of one embodiment of the present invention.

FIG. 6 illustrates an example of a cross-sectional view of a pixel structure including the element layer 101, the element layer 100, and a bonding surface between these layers.

<Element Layer 101>

The element layer 101 includes the transistor 104, the transistor 105, the transistor 106, and the capacitor 108 that constitute the pixel circuit 331. A semiconductor substrate 211 is provided with the transistors 104, 105, and 106.

In the element layer 101, an insulating layer 212, an insulating layer 213, an insulating layer 214, an insulating layer 215, an insulating layer 216, an insulating layer 217, an insulating layer 228, and an insulating layer 229 are provided. Moreover, a conductive layer 131 is provided. Here, the conductive layer 131 functions as part of the wiring 125.

The insulating layer 212 functions as a protective film. The insulating layers 213, 214, 215, 217, and 228 each function as an interlayer insulating film and a planarization film. The insulating layer 216 functions as a dielectric layer of the capacitor 108.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As the dielectric layer of the capacitor, a silicon nitride film, a silicon oxide film, an aluminum oxide film, or the like can be used.

The insulating layer 229 and the conductive layer 131 function as bonding layers. That is, the insulating layer 229 and the conductive layer 131 are layers in the element layer 101 that are closest to the element layer 100. Thus, the transistors 104, 105, and 106 and the capacitor 108 are provided between the semiconductor substrate 211 and the insulating layer 229 and the conductive layer 131.

The conductive layer 131, the one of the source and the drain of the transistor 104, the gate of the transistor 105, and the one electrode of the capacitor 108 are electrically connected to each other. The one of the source and the drain of the transistor 105 and the one of the source and the drain of the transistor 106 are electrically connected to each other. The other of the source and the drain of the transistor 104 is electrically connected to the wiring 122. The other of the source and the drain of the transistor 106 is electrically connected to the wiring 352. The other electrode of the capacitor 108 is electrically connected to a GND wiring or the like.

The semiconductor substrate 211 is provided with the transistors 104, 105, and 106 illustrated in FIG. 6. The transistors 104, 105, and 106 include a conductive layer 280 functioning as a gate, an insulating layer 282 functioning as a gate insulating layer, and n-type regions 284 functioning as a source region and a drain region.

As the semiconductor substrate 211, a semiconductor such as a silicon-based semiconductor can be used, and single crystal silicon can be used, for example. It is preferable that the semiconductor substrate 211 be a p-type substrate containing an element imparting p-type conductivity, such as boron. Note that it is preferable that the n-type regions 284 contain an element imparting n-type conductivity, such as arsenic or phosphorus, and exhibit n-type conductivity.

Figure 7A:
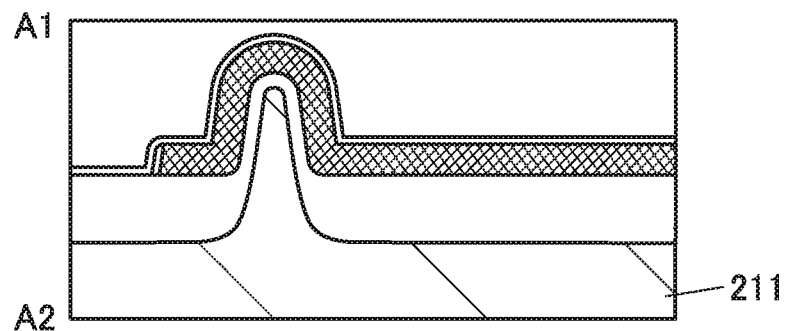
FIGS. 7A to 7C illustrate Si transistors of one embodiment of the present invention.

Furthermore, the transistors 104, 105, and 106 illustrated in FIG. 6 are each a fin-type transistor including a channel formation region in the semiconductor substrate 211, and FIG. 7A shows a cross section in the channel width direction (cross section taken along line A1-A2 in FIG. 6).

Figure 7B:
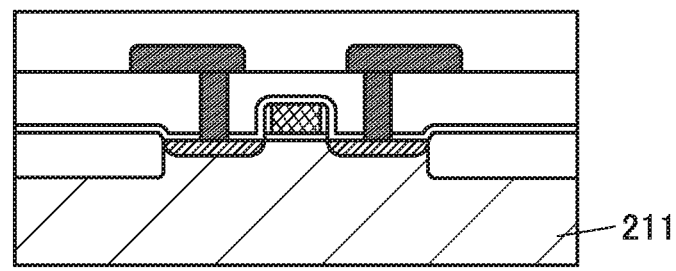

Note that the structures of the transistors 104, 105, and 106 are not limited to those illustrated in FIG. 6 and can be set as appropriate. For example, the transistors 104, 105, and 106 may each be a planar transistor as illustrated in FIG. 7B.

Figure 7C:
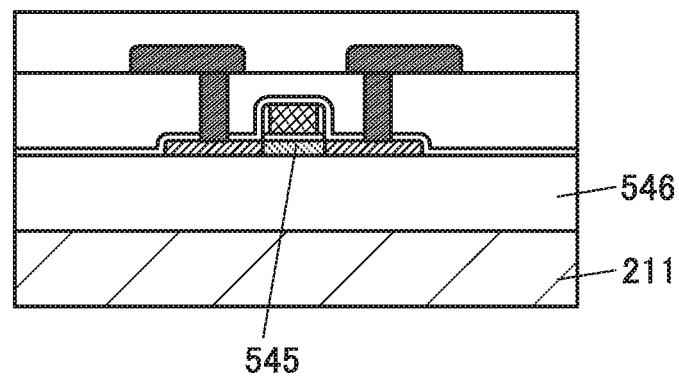

Moreover, for example, the transistors 104, 105, and 106 may each be a transistor including a semiconductor layer 545 of a silicon thin film, as illustrated in FIG. 7C. The semiconductor layer 545 can be single crystal silicon formed over an insulating layer 546 over the semiconductor substrate 211 (silicon on insulator (SOI)), for example.

For a conductor that can be used for a wiring, an electrode, and a plug that are used for electrically connecting devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; and the like is selected and used as appropriate. The conductor is not limited to a single layer, and may be a plurality of layers including different materials.

<Element Layer 100>

The element layer 100 includes the photoelectric conversion device 240 and the transistor 103 that constitute the pixel circuit 331. The photoelectric conversion device 240 and the transistor 103 are provided in a semiconductor substrate 243.

In the element layer 100, an insulating layer 241, an insulating layer 242, an insulating layer 245, an insulating layer 246, an insulating layer 232, an insulating layer 231, and a conductive layer 132 are provided. Here, the conductive layer 132 functions as part of the wiring 124.

The photoelectric conversion device 240 is a pn-junction photodiode formed in the p-type semiconductor substrate 243 and includes a p-type region 248 and an n-type region 244. Here, the semiconductor substrate 243 and the n-type region 244 can have a structure similar to that of the semiconductor substrate 211 and the n-type region 284. The p-type region 248 preferably has a higher concentration of impurities imparting p-type conductivity than the other regions of the semiconductor substrate 243.

The photoelectric conversion device 240 is a buried photodiode, and the n-type region 244 functions as one electrode of the photoelectric conversion device 240. The thin p-type region 248 that is provided on the surface side (a side from which current is extracted) of the n-type region 244 can suppress a dark current so that noise can be reduced.

The insulating layer 241 functions as a protective film. The insulating layer 242 functions as an element isolation layer. The insulating layer 245 has a function of suppressing outflow of carriers. The insulating layers 246 and 232 function as an interlayer insulating film and a planarization film.

The insulating layer 231 and the conductive layer 132 function as bonding layers. That is, the insulating layer 231 and the conductive layer 132 are layers in the element layer 100 that are closest to the element layer 101. Thus, the transistor 103 and the photoelectric conversion device 240 are provided between the insulating layer 245 and the insulating layer 231 and the conductive layer 132.

The semiconductor substrate 243 is provided with a groove that separates pixels, and the insulating layer 245 is provided on the top surface of the silicon substrate and in the groove. The insulating layer 245 can suppress outflow of carriers generated in the photoelectric conversion device 240 to an adjacent pixel. The insulating layer 245 also has a function of suppressing entry of stray light. Therefore, color mixture can be suppressed with the insulating layer 245. Note that an anti-reflection film may be provided between the top surface of the silicon substrate and the insulating layer 245.

The insulating layer 242 can be formed by a local oxidation of silicon (LOCOS) method, a shallow trench isolation (STI) method, or the like. The insulating layer 245 can be formed using an inorganic insulating film of silicon oxide, silicon nitride, or the like or an organic insulating film of polyimide, acrylic, or the like, for example. The insulating layer 245 may have a multilayer structure.

The transistor 103 can have a structure similar to that of the transistor 104 and the like. Thus, the n-type regions 244 function as the source region and the drain region of the transistor 103.

Here, as illustrated in FIG. 6, the one electrode (i.e., the cathode) of the photoelectric conversion device 240 and the one of the source and the drain of the transistor 103 are preferably formed in the same n-type region 244. With such a structure, current of the photoelectric conversion device 240 does not need to be extracted by a plug or the like provided in contact with the cathode of the photoelectric conversion device 240. Thus, the surface side of the n-type region 244 functioning as the one electrode of the photoelectric conversion device 240 can be covered with the p-type region 248, so that a dark current can be suppressed, and noise can be reduced. Therefore, it is preferable to provide the transistor 103 together with the photoelectric conversion device 240 in the element layer 100.

The other of the source and the drain of the transistor 103 and the conductive layer 132 are electrically connected to each other. A region corresponding to the anode of the photoelectric conversion device 240 in the semiconductor substrate 243 is electrically connected to the wiring 121 functioning as a power supply line.

<Bonding>

Next, bonding of the element layer 101 and the element layer 100 is described.

In the element layer 101, the insulating layer 229 and the conductive layer 131 are provided at the side of the surface of the semiconductor substrate 211 where the transistors 104 to 106 are provided. The conductive layer 131 includes a region embedded in the insulating layer 229. Furthermore, the surfaces of the insulating layer 229 and the conductive layer 131 are planarized to have the same level.

In the element layer 100, the insulating layer 231 and the conductive layer 132 are provided at the side of the surface of the semiconductor substrate 243 where the transistor 103 is provided. The conductive layer 132 includes a region embedded in the insulating layer 231. Furthermore, the surfaces of the insulating layer 231 and the conductive layer 132 are planarized to have the same level.

Here, a main component of the conductive layer 131 and a main component of the conductive layer 132 are preferably the same metal element. Moreover, the insulating layers 229 and 231 are preferably formed of the same components.

For example, Cu, Al, Sn, Zn, W, Ag, Pt, Au, or the like can be used for the conductive layers 131 and 132. Preferably, Cu, Al, W, or Au is used for easy bonding. In addition, silicon oxide, silicon oxynitride, silicon nitride oxide, silicon nitride, titanium nitride, or the like can be used for the insulating layers 229 and 231.

That is, the same metal material selected from the above-described metal materials is preferably used for the insulating layers 131 and 132. Furthermore, the same insulating material selected from the above-described insulating materials is preferably used for the insulating layers 229 and 231. With this structure, bonding can be performed with a boundary between the element layer 101 and the element layer 100 as a bonding position, so that the bonding portion 130 can be formed in a portion where the conductive layer 131 and the conductive layer 132 are in contact with each other.

Note that the conductive layers 131 and 132 may each have a multilayer structure of a plurality of layers; in that case, the outer layers (bonding surfaces) are formed of the same metal material. The insulating layers 229 and 231 may have a multilayer structure of a plurality of layers; in that case, the outer layers (bonding surfaces) are formed of the same insulating material.

With the bonding, the conductive layers 131 and 132 can be electrically connected to each other. Moreover, connection with high mechanical strength can be obtained between the insulating layers 229 and 231.

For direct bonding between the conductive layers, surface activated bonding and diffusion bonding can be used. Surface activated bonding is a method in which an oxide film and a layer adsorbing impurities over the surface of the conductive layers are removed by sputtering treatment or the like and the cleaned and activated surfaces of the conductive layers are made to be in contact with and bonded to each other. Diffusion bonding is a method in which the surfaces of the conductive layers are bonded to each other by adjusting temperature and pressure together. Both methods can cause bonding at an atomic level and therefore the bonding with excellent electric and mechanical strength can be achieved.

For direct bonding between the insulating layers, hydrophilic bonding or the like can be used after high planarity is obtained by polishing or the like. Hydrophilic bonding is a method in which the surfaces of the insulating layers are subjected to hydrophilicity treatment with oxygen plasma or the like, arranged in contact with and bonded to each other temporarily, and then dehydrated by heat treatment to perform final bonding. The hydrophilic bonding can also cause bonding at an atomic level; thus, bonding with excellent mechanical strength can be achieved.

The insulating layers and the metal layers are mixed on the bonding surfaces of the element layer 101 and 100; therefore, for example, surface activated bonding and hydrophilic bonding are preferably performed in combination when the element layer 101 and 100 are bonded to each other.

For example, the following method can be used: the surfaces of the metal layers are made clean after polishing, the surfaces of the metal layers are subjected to antioxidant treatment and hydrophilicity treatment, and then bonding is performed. Alternatively, hydrophilicity treatment may be performed on the surfaces of the metal layers with the use of hardly oxidizable metal such as Au. Note that a bonding method other than the above method may be used.

By the bonding, part of the pixel circuit 331 included in the element layer 100 and another part of the pixel circuit included in the element layer 101 are connected to each other, whereby the node FD that is formed of the other of the source and the drain of the transistor 103, the wiring 124, the bonding portion 130, the wiring 125, the one of the source and the drain of the transistor 104, the one electrode of the capacitor 108, and the gate of the transistor 105 can be formed. Accordingly, the photoelectric conversion device 240 and at least parts of the transistor 104, the transistor 105, and the transistor 106 overlap with each other. Thus, even in the case of miniaturization of a pixel, the proportion of the area occupied by the photoelectric conversion device 240 in each pixel can be increased, so that an imaging device having high resolution and high sensitivity can be provided.

Note that although FIG. 6 illustrates an example in which the transistors 105 and 106 and the photoelectric conversion device 240 overlap with each other, the present invention is not limited to this. The layout of the photoelectric conversion device 240, the transistors 103 to 106, the capacitor 108, and the like can be set as appropriate.

In the pixel structure illustrated in FIG. 6, the conductive layer 131 and the conductive layer 132 are bonded to each other so that the element layer 101 is electrically connected to the element layer 100; however, the present invention is not limited thereto. For example, the element layer 101 may be electrically connected to the element layer 100 by bump bonding.

In the above, the structure in which the components of the pixel circuit 331 are separately formed in the element layer 100 and the element layer 101 is described. In this case, the driver circuit 332 and the driver circuit 333 may be formed in the element layer 101 or the element layer 100. The components of the driver circuit 332 and the driver circuit 333 may be separately formed in the element layer 100 and the element layer 101. For example, n-channel transistors of the driver circuits 332 and 333 may be formed in one of the element layers 100 and 101, and p-channel transistors of the driver circuits 332 and 333 may be formed in the other of the element layers 100 and 101.

<Configuration 2 of Imaging Device>

Figure 8:
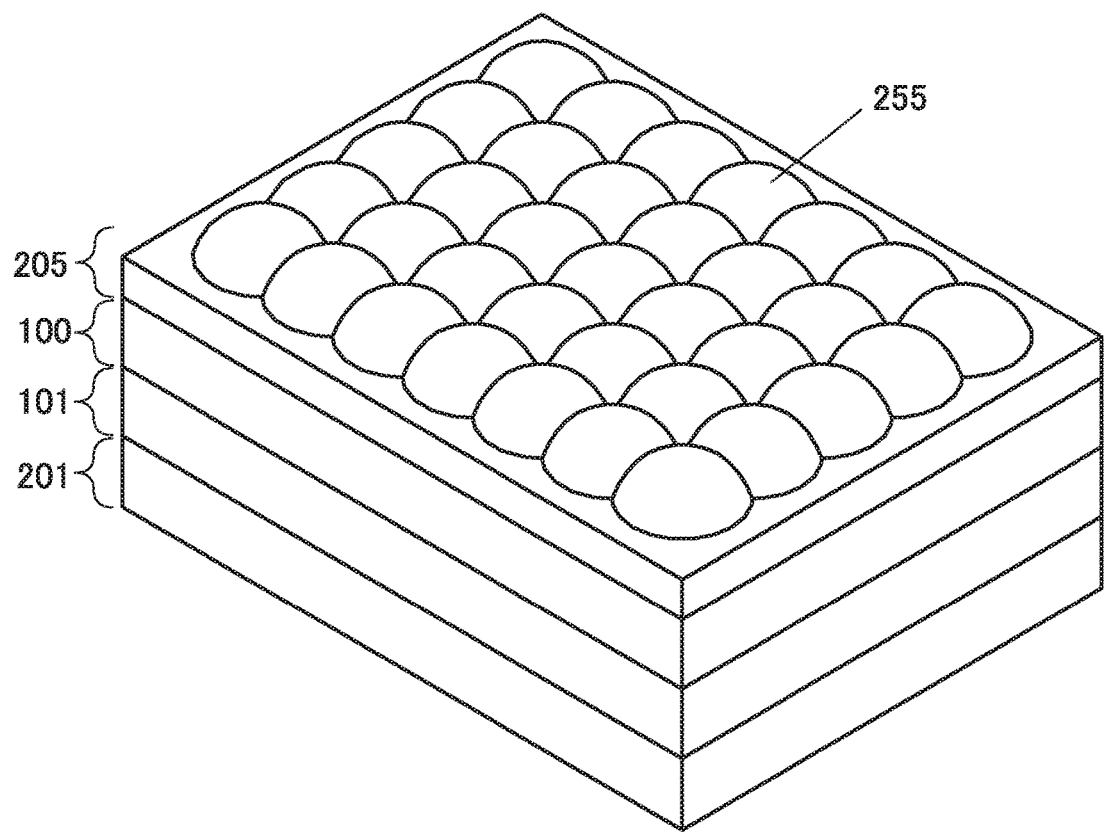
FIG. 8 is a perspective view illustrating an imaging device of one embodiment of the present invention.

All or part of the driver circuit 332 and the driver circuit 333 may be formed in an element layer different from the element layer 100 or 101. FIG. 8 is a perspective view of an imaging device of one embodiment of the present invention. The imaging device includes an element layer 201 including the driver circuit 333, the element layer 101 over the element layer 201, the element layer 100 over the element layer 101, and an element layer 205 over the element layer 100.

Here, in the element layer 100 and the element layer 101, the pixel circuit 331 is provided as in the above configuration. In addition, the driver circuit 332 may be provided in the element layer 100 and the element layer 101. In the element layer 201, the driver circuit 333 is provided. An optical conversion layer such as a color filter is provided in the element layer 205. In addition, a microlens array 255 can be provided in the element layer 205.

Although FIG. 8 and the like show that the imaging device is divided into the four element layers for clarity of the description, the kind, number, and position of elements included in each element layer are not limited to the description of this embodiment. For example, the element, such as the insulating layer, the wiring, and the plug, that is positioned near the boundary between the element layers is sometimes positioned in an element layer different from the element layer described in this embodiment. Alternatively, an element different from the insulating layer, the wiring, the plug, and the like that are positioned near the boundary between the element layers may be included.

<Structure 2 of Imaging Device>

Next, a stacked-layer structure of the imaging device illustrated in FIG. 8 is described with reference to a cross-sectional view.

Figure 9:
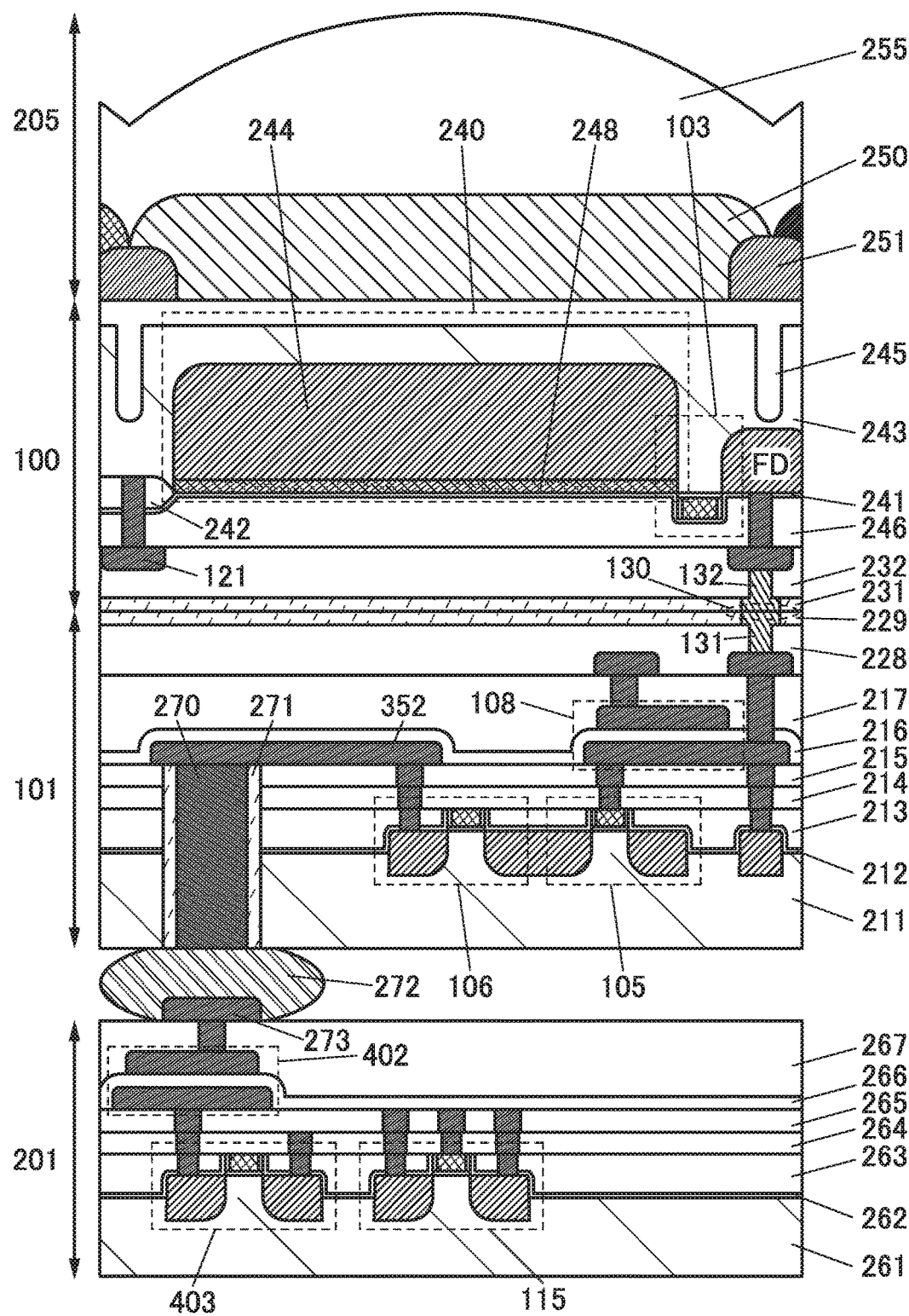
FIG. 9 is a cross-sectional view illustrating a pixel of one embodiment of the present invention.

FIG. 9 is an example of a cross-sectional view of a stacked-layer structure in which the element layer 201, the element layer 101, the element layer 100, and the element layer 205 are stacked in this order. The element layers 201 and 101 are bonded to each other by bump bonding. Thus, the element layer 201 is positioned on the rear side of the semiconductor substrate 211 (at the side where the transistors 104 to 106 are not formed).

Note that the element layer 101 and the element layer 100 have structures similar to those illustrated in FIG. 6 and the like, and the description of FIG. 6 and the like can be referred to for details of the element layers 101 and 100. Note that some components of the element layers 101 and 100 in FIG. 9 are arranged differently from those in FIG. 6. For example, in FIG. 9, the transistor 104 is not illustrated because the transistor 104 is positioned in the channel width direction of the transistors 105 and 106. The structures of the element layer 201 and the element layer 205 are described in detail below.

<Element Layer 201>

The element layer 201 includes the driver circuit 333 provided in the semiconductor substrate 261. The CDS circuit 400 and the A/D converter 410 that are illustrated in FIG. 5 and the like are included in the driver circuit 333. As part of the circuit, FIG. 9 illustrates the capacitor 402 and the transistor 403 that are included in the CDS circuit 400 and a transistor 115 that is included in the A/D converter 410. Here, one electrode of the capacitor 402 is electrically connected to one of a source and a drain of the transistor 403.

In the element layer 201, an insulating layer 262, an insulating layer 263, an insulating layer 264, an insulating layer 265, an insulating layer 266, and an insulating layer 267 are provided. A conductive layer 273 is provided over the insulating layer 267.

The insulating layer 262 functions as a protective film. The insulating layers 263, 264, 265, and 267 each function as an interlayer insulating film and a planarization film. The insulating layer 266 functions as a dielectric layer of the capacitor 108.

The semiconductor substrate 261 has a structure similar to that of the above-described semiconductor substrate 211. The transistor 403 and the transistor 115 have structures similar to those of the above-described transistor 105 and the like. The capacitor 402 has a structure similar to that of the above-described capacitor 108. The insulating layers 262, 263, 264, 265, 266, and 267 have structures similar to those of the insulating layers 212, 213, 214, 215, 216, and 217, which are described above.

The conductive layer 273 is electrically connected to the other electrode of the capacitor 108, and the element layer 201 is electrically connected to the element layer 101 through the conductive layer 273.

Here, the element layer 101 includes a conductive layer 270 electrically connected to the wiring 352 and is electrically connected to the element layer 201 through the conductive layer 270. The conductive layer 270 is provided in an opening formed in the semiconductor substrate 211, the insulating layer 212, the insulating layer 213, the insulating layer 214, and the insulating layer 215. The top surface of the conductive layer 270 is exposed from the insulating layer 215 and is in contact with the wiring 352, and the bottom surface of the conductive layer 270 is exposed from the semiconductor substrate 211. An insulating layer 271 is preferably positioned in contact with a side surface of the conductive layer 270. The insulating layer 271 functions as a protective film.

The conductive layer 270 and the insulating layer 271 are formed using a through-silicon via (TSV) technique. In this case, the semiconductor substrate 211 is preferably made thin by polishing.

As illustrated in FIG. 9, a bump 272 is provided between the conductive layers 273 and 270. The bump 272 can be formed using a conductive material containing gold (Au), nickel (Ni), indium (In), tin (Sn), or the like. For example, solder may be used for the bump 272.

With the bump 272, the conductive layers 270 and 273 can be electrically connected to each other, and the element layers 101 and 201 can be electrically and mechanically bonded to each other. Thus, the other of the source and the drain of the transistor 106 can be electrically connected to the one of the source and the drain of the transistor 403 through the capacitor 402. In this manner, the pixel circuit 331 provided in the element layers 100 and 101 can be electrically connected to the driver circuit 333 provided in the element layer 201.

Note that although the element layers 201 and 101 are bonded to each other with the bump 272 in the stacked-layer structure illustrated in FIG. 9; however, the present invention is not limited thereto. For example, bumps may be provided on the conductive layer 270 side and on the conductive layer 273 side, so that the element layers 201 and 101 are bonded to each other. Moreover, for example, the element layers 201 and 101 may be bonded to each other by a method similar to that of bonding the conductive layer 131 and the insulating layer 229 to the conductive layer 132 and the insulating layer 231.

<Element Layers 205>

The element layer 205 is formed over the element layer 100. The element layer 205 includes a light-blocking layer 251, an optical conversion layer 250, and the microlens array 255.

The light-blocking layer 251 can prevent entry of light into an adjacent pixel. As the light-blocking layer 251, a metal layer of aluminum, tungsten, or the like can be used. Alternatively, the metal layer and a dielectric film having a function of an anti-reflection film may be stacked.

For the optical conversion layer 250, a color filter or the like can be used. Color filters of R (red), G (green), B (blue), Y (yellow), C (cyan), M (magenta), and the like are assigned to the respective pixels, whereby a color image can be obtained.

When a wavelength cut filter is used for the optical conversion layer 250, the imaging device can capture images in various wavelength regions For example, when a filter that blocks light having a wavelength shorter than or equal to that of visible light is used for the optical conversion layer 250, an infrared imaging device can be obtained. When a filter that blocks light having a wavelength shorter than or equal to that of near infrared light is used as the optical conversion layer 250, a far-infrared imaging device can be obtained. When a filter that blocks light having a wavelength longer than or equal to that of visible light is used as the optical conversion layer 250, an ultraviolet imaging device can be obtained.

Furthermore, when a scintillator is used as the optical conversion layer 250, an imaging device that takes an image visualizing the intensity of radiations and is used for an X-ray imaging device or the like can be obtained. Radiations such as X-rays that pass through an object to enter a scintillator are converted into light (fluorescence) such as visible light or ultraviolet light owing to a photoluminescence phenomenon. Then, the photoelectric conversion device 240 detects the light to obtain image data. Moreover, the imaging device having the above structure may be used in a radiation detector or the like.

A scintillator contains a substance that, when irradiated with radiation such as X-rays or gamma rays, absorbs energy thereof to emit visible light or ultraviolet light. For example, it is possible to use a resin or ceramics in which $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, or $ZnO$ is dispersed.

The microlens array 255 is provided over the optical conversion layer 250. Light transmitted through lenses of the microlens array 255 passes through the optical conversion layer 250 that is placed under the microlens array 255 and is emitted to the photoelectric conversion device 240. With the microlens array 255, collected light can be incident on the photoelectric conversion device 240; thus, photoelectric conversion can be efficiently performed. The microlens array 255 is preferably formed using a resin, glass, or the like with a high visible-light transmitting property.

<Configuration 3 of Imaging Device>

An element layer including a memory circuit may be formed between the element layer 201 and the element layer 101.

A transistor including a metal oxide in a channel formation region (hereinafter, referred to as an OS transistor) is preferably used for the memory circuit. The OS transistor has extremely low off-state current and can suppress unnecessary outflow of data from the pixel circuit. Therefore, the use of the OS transistor as a cell transistor in the memory circuit can suppress unnecessary outflow of data and decrease the frequency of refresh operation. Accordingly, power consumption can be reduced.

The OS transistor can be formed over a silicon device with an insulating layer provided therebetween without a complicated step such as bonding or bump bonding. Therefore, a memory circuit including an OS transistor can be manufactured at relatively low manufacturing cost.

Figure 10A:
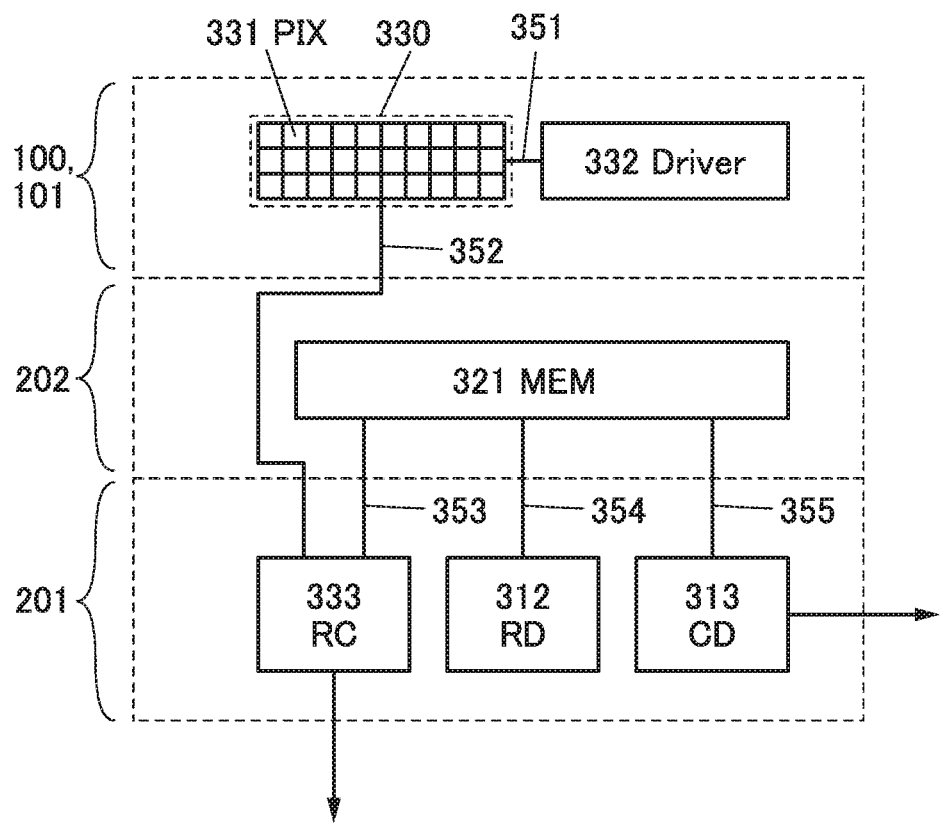
FIGS. 10A and 10B are block diagrams illustrating an imaging device of one embodiment of the present invention.

FIG. 10A is a schematic block diagram illustrating electrical connection between components included in the element layer 201, an element layer 202, the element layer 101, and the element layer 100.

The element layer 202 includes a memory circuit 321 (MEM) that includes the OS transistor. The element layers 201, 101, and 100 have structures similar to those described above. In other words, the element layers 101 and 100 include the pixel circuit 331 (PIX) and the driver circuit 332 (Driver), and the element layer 201 includes the driver circuit 333 (RC) that functions as a reading circuit. Furthermore, the element layer 201 includes a row driver 312 (RD) and a column driver 313 (CD) that function as driver circuits of the memory circuit 321. Note that the element layer 205 is not illustrated here.

The pixel circuits 331 are provided in a matrix and are electrically connected to the driver circuit 332 through the wiring 351. The driver circuit 332 can control data acquisition operation, selection operation, and the like of the pixel circuit 331. For the driver circuit 332, a shift register or the like can be used, for example.

Moreover, the pixel circuit 331 is electrically connected to the driver circuit 333 through the wiring 352. The driver circuit 333 functions as a reading circuit and includes a correlated double sampling circuit (CDS circuit) for reducing noise and an A/D converter for converting analog data into digital data. The driver circuit 333 may include a driver circuit for controlling the operation of the reading circuit, and the like.

The driver circuit 333 is electrically connected to the memory circuit 321 through a wiring 353. The memory circuit 321 can retain digital data output from the driver circuit 333. Alternatively, digital data can be output directly to the outside from the driver circuit 333.

The memory circuit 321 is electrically connected to the row driver 312 through a wiring 354. In addition, the memory circuit 321 is electrically connected to the column driver 313 through a wiring 355. The row driver 312 is a driver circuit of the memory circuit 321 and can control data writing and reading. The column driver 313 is a driver circuit of the memory circuit 321 and can control data reading.

Figure 10B:
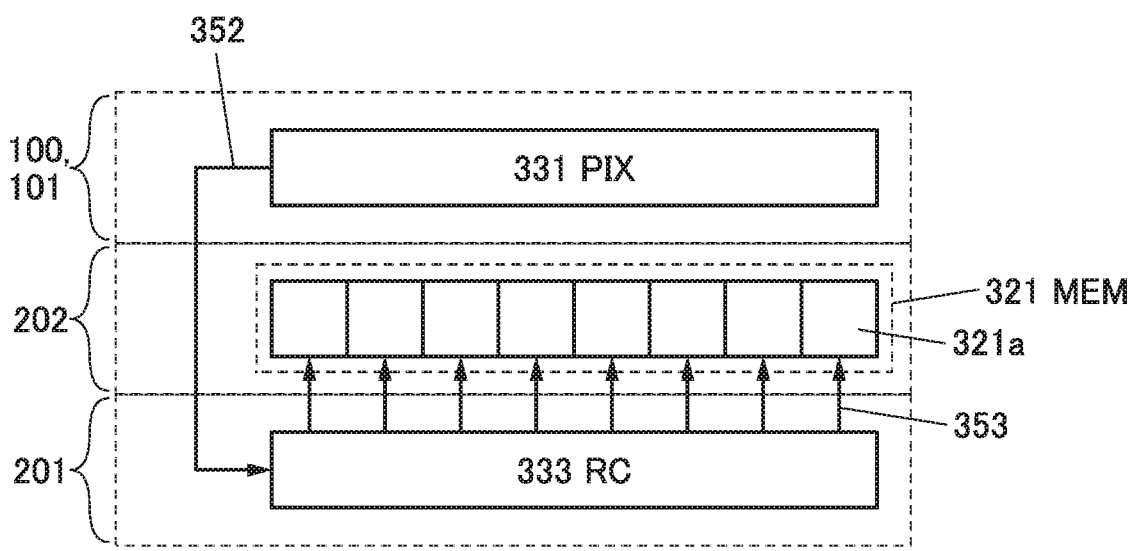

The details of the connection relation between the pixel circuit 331, the driver circuit 333, and the memory circuit 321 are described with reference to a block diagram of FIG. 10B. The number of reading circuits included in the driver circuit 333 can be equal to the number of the pixel circuits 331, and one reading circuit is electrically connected to one pixel circuit 331 through the wiring 352. The reading circuits in the driver circuit 333 are connected to the plurality of wirings 353, and each of the wirings 353 is electrically connected to one memory cell 321a. Note that a data holding circuit may be provided between the reading circuit of the driver circuit 333 and the memory circuit 321.

The A/D converter included in the reading circuit of the driver circuit 333 outputs binary data of a predetermined number of bits in parallel. Accordingly, the A/D converter is connected to the memory cells 321a for the number of bits. For example, when an output of the A/D converter is 8 bits, the memory cell 321a is connected to eight memory cells 321a.

In the imaging device of one embodiment of the present invention with the configuration, the A/D conversion of the analog data obtained in all of the pixel circuits 331 can be performed in parallel, and the converted digital data can be directly written to the memory circuit 321. In other words, operations from imaging to data storing in the memory circuit can be performed at high speed. In addition, the imaging operation, the AD conversion operation, and the reading operation can be performed in parallel. With such a configuration, a global shutter method in which charge accumulation operation is performed simultaneously in all the pixels can be relatively easily used.

<Memory Circuit>

Figure 11A:
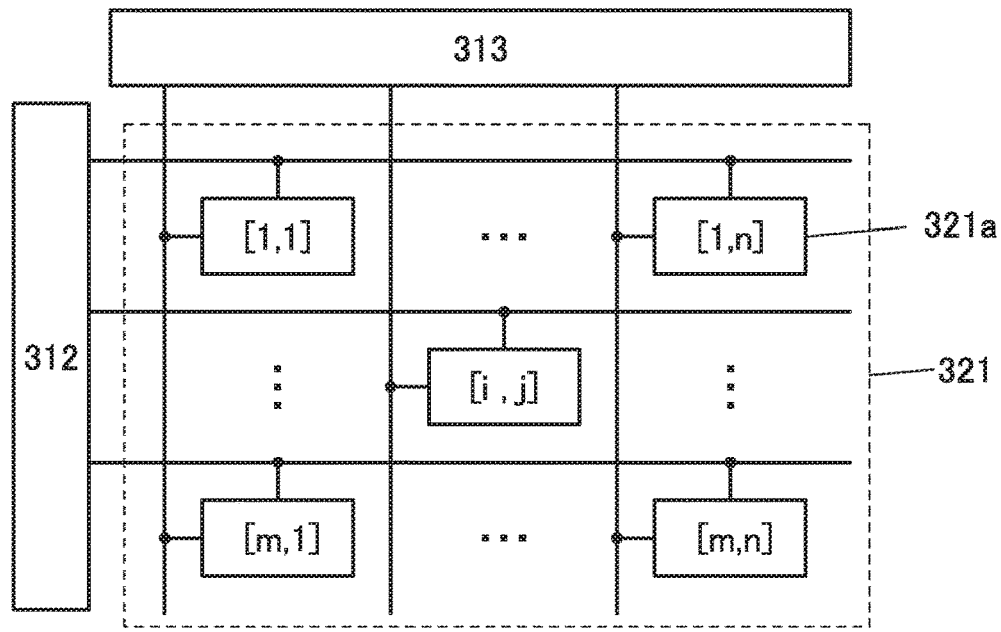
FIG. 11A is a block diagram illustrating a memory circuit of one embodiment of the present invention.

FIG. 11A illustrates the connection relation between the memory cell 321a included in the memory circuit 321, the row driver 312, and the column driver 313. Here, an OS transistor can be used as a transistor included in the memory cell 321a.

The memory circuit 321 includes m×n memory cells 321a in total; m memory cells (m is an integer greater than or equal to 1) in a column and n memory cells (n is an integer greater than or equal to 1) in a row, and the memory cells 321a are arranged in a matrix. FIG. 11A also illustrates addresses of the memory cells 321a. For example, [1,1] represents a memory cell 321a positioned at an address of the first row and the first column, and [i,j] (i is an integer of 1 to m, and j is an integer of 1 to n) represents a memory cell 321a positioned at an address of the i-th row and the j-th column. Note that the number of wirings connecting the memory circuit 321 to the row driver 312 is determined by the configuration of the memory cell 321a, the number of memory cells 321a included in one column, and the like. The number of wirings connecting the memory circuit 321 to the column driver 313 is determined by the configuration of the memory cell 321a, the number of memory cells 321a included in one row, and the like.

FIGS. 11B to 11E illustrate a memory cell 321aA to a memory cell 321aD that can be used as the memory cell 321a. Note that in the following description, a bit line and the like can be connected to the column driver 313. A word line and the like can be connected to the row driver 312. Note that the bit line and the like are electrically connected to the reading circuit of the driver circuit 333 too, but are not illustrated here.

For the row driver 312 and the column driver 313, a decoder or a shift register can be used, for example. Note that a plurality of row drivers 312 and a plurality of column drivers 313 may be provided.

[DOSRAM]

Figure 11B:
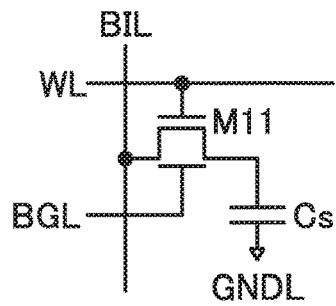
FIGS. 11B to 11E are circuit diagrams each illustrating the memory circuit of one embodiment of the present invention.

FIG. 11B illustrates a circuit configuration example of the memory cell 321aA of a DRAM type. In this specification and the like, a DRAM using an OS transistor is referred to as a dynamic oxide semiconductor random access memory (DOSRAM). The memory cell 321aA includes a transistor M11 and a capacitor Cs.

A first terminal of the transistor M11 is connected to a first terminal of the capacitor Cs. A second terminal of the transistor M11 is connected to a wiring BIL. A gate of the transistor M11 is connected to a wiring WL. A back gate of the transistor M11 is connected to a wiring BGL. A second terminal of the capacitor Cs is connected to a wiring GNDL. The wiring GNDL is a wiring for supplying a low-level potential (reference potential).

The wiring BIL functions as a bit line. The wiring WL functions as a word line. The wiring BGL functions as a wiring for applying a potential to the back gate of the transistor M11. The threshold voltage of the transistor M11 can be increased or decreased by supplying a given potential to the wiring BGL.

Data writing and data reading are performed in such a manner that a high-level potential is applied to the wiring WL to turn on the transistor M11, and thus the wiring BIL is electrically connected to the first terminal of the capacitor Cs.

An OS transistor is preferably used as the transistor M11. An oxide semiconductor containing at least one of indium, an element M (the element M is aluminum, gallium, yttrium, or tin), and zinc is preferably used for a semiconductor layer of the OS transistor. In particular, an oxide semiconductor containing indium, gallium, and zinc is preferably included.

The OS transistor using an oxide semiconductor containing indium, gallium, and zinc has a characteristic of an extremely low off-state current. The use of the OS transistor for the transistor M11 enables extremely low leakage current of the transistor M11. That is, with the use of the transistor M11, written data can be held for a long time, and thus the frequency of the refresh operation for the memory cell can be decreased. In addition, refresh operation for the memory cell can be omitted.

[NOSRAM]

Figure 11C:
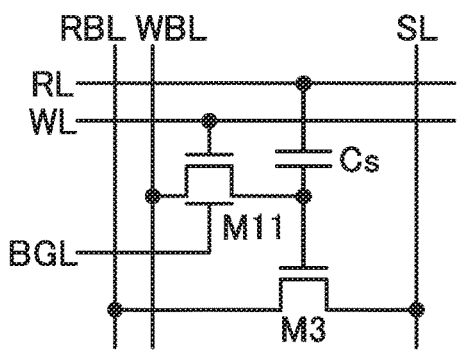

FIG. 11C illustrates a circuit configuration example of the memory cell 321aB that is of a gain cell including two transistors and one capacitor (also referred to as "2Tr1C-type"). The memory cell 321aB includes the transistor M11, a transistor M3, and the capacitor Cs.

The first terminal of the transistor M11 is connected to the first terminal of the capacitor Cs. The second terminal of the transistor M11 is connected to a wiring WBL. A gate of the transistor M11 is connected to the wiring WL. The back gate of the transistor M11 is connected to the wiring BGL. The second terminal of the capacitor Cs is connected to a wiring RL. A first terminal of the transistor M3 is connected to a wiring RBL. A second terminal of the transistor M3 is connected to a wiring SL. A gate of the transistor M3 is connected to the first terminal of the capacitor Cs.

The wiring WBL functions as a write bit line. The wiring RBL functions as a read bit line. The wiring WL functions as a word line. The wiring RL functions as a wiring for applying a predetermined potential to the second terminal of the capacitor Cs. The reference potential is preferably applied to the wiring RL at the time of data writing and during data holding.

The wiring BGL functions as a wiring for applying a potential to the back gate of the transistor M11. The threshold voltage of the transistor M11 can be increased or decreased by supplying a given potential to the wiring BGL.

Data writing is performed in such a manner that a high-level potential is applied to the wiring WL to turn on the transistor M11, and thus the wiring WBL is electrically connected to the first terminal of the capacitor Cs. Specifically, when the transistor M11 is on, a potential corresponding to data to be stored is applied to the wiring WBL, and the potential is written to the first terminal of the capacitor Cs and the gate of the transistor M3. Then, the low-level potential is applied to the wiring WL so that the transistor M11 is turned off. Accordingly, the potentials of the first terminal of the capacitor Cs and the gate of the transistor M3 are held.

Data reading is performed by applying a predetermined potential to the wiring RL and the wiring SL. A current flowing between a source and a drain of the transistor M3 and the potential of the first terminal of the transistor M3 are determined by the potential of the gate of the transistor M3 and the potential of the second terminal of the transistor M3. Therefore, by reading the potential of the wiring RBL connected to the first terminal of the transistor M3, a potential retained in the first terminal of the capacitor Cs (or the gate of the transistor M3) can be read. That is, information written in the memory cell can be read on the basis of the potential retained in the first terminal of the capacitor Cs (or the gate of the transistor M3). Alternatively, existence or absence of information written to this memory cell can be found.

Figure 11D:
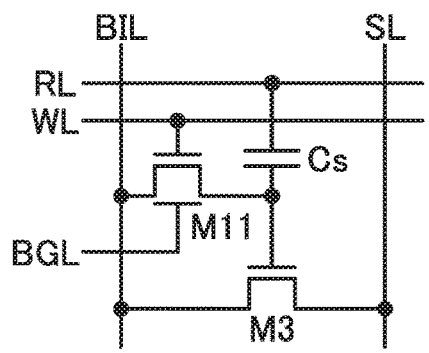

Furthermore, as illustrated in FIG. 11D, the wiring WBL and the wiring RBL may be combined into one wiring BIL. In the memory cell 321aC illustrated in FIG. 11D, the wiring WBL and the wiring RBL of the memory cell 321aB are combined into one wiring BIL, and the second terminal of the transistor M11 and the first terminal of the transistor M3 are electrically connected to the wiring BIL. In other words, the memory cell 321aC operates with one wiring BIL functioning as a write bit line and a read bit line.

Note that also in the memory cell 321aB and the memory cell 321aC, an OS transistor is preferably used as the transistor M11. A memory device using a 2Tr1C-type memory cell using an OS transistor as the transistor M11, such as the memory cell 321aB and the memory cell 321aC, is referred to as a non-volatile oxide semiconductor random access memory (NOSRAM).

Figure 11E:
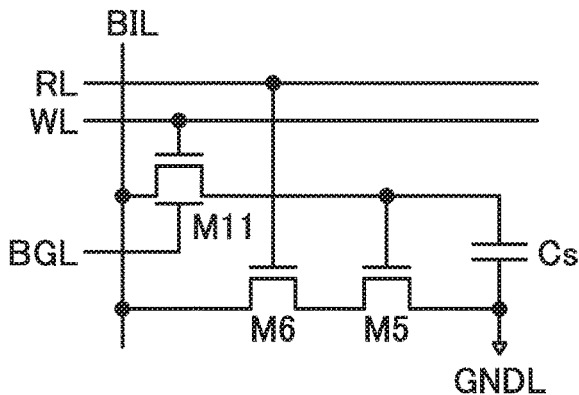

FIG. 11E illustrates a circuit configuration example of the memory cell 321aD that is of a gain cell including three transistors and one capacitor (also referred to as "3Tr1C-type"). The memory cell 321aD includes the transistor M11, a transistor M5, a transistor M6, and the capacitor Cs.

The first terminal of the transistor M11 is connected to the first terminal of the capacitor Cs. The second terminal of the transistor M11 is connected to the wiring BIL. The gate of the transistor M11 is connected to the wiring WL. The back gate of the transistor M11 is electrically connected to the wiring BGL. The second terminal of the capacitor Cs is electrically connected to a first terminal of the transistor M5 and the wiring GNDL. A second terminal of the transistor M5 is connected to a first terminal of the transistor M6, and a gate of the transistor M5 is connected to the first terminal of the capacitor Cs. A second terminal of the transistor M6 is connected to the wiring BIL, and a gate of the transistor M6 is connected to the wiring RL.

The wiring BIL functions as a bit line. The wiring WL functions as a write word line. The wiring RL functions as a read word line.

The wiring BGL functions as a wiring for applying a potential to the back gate of the transistor M11. The threshold voltage of the transistor M11 can be increased or decreased by supplying a given potential to the wiring BGL.

Data writing is performed in such a manner that a high-level potential is applied to the wiring WL to turn on the transistor M11, and thus the wiring BIL is electrically connected to the first terminal of the capacitor Cs. Specifically, when the transistor M11 is on, a potential corresponding to data to be stored is applied to the wiring BIL, and the potential is written to the first terminal of the capacitor Cs and the gate of the transistor M5. Then, the low-level potential is applied to the wiring WL so that the transistor M11 is turned off. Accordingly, the potentials of the first terminal of the capacitor Cs and the gate of the transistor M5 are held.

Data is read by precharging the wiring BIL to a predetermined potential, and then making the wiring BIL in an electrically floating state and applying the high-level potential to the wiring RL. Since the wiring RL is supplied with the high-level potential, the transistor M6 is turned on, so that the wiring BIL is electrically connected to the second terminal of the transistor M5. At this time, the potential of the wiring BIL is applied to the second terminal of the transistor M5; however, the potential of the second terminal of the transistor M5 and the potential of the wiring BIL are changed depending on the potential held in the first terminal of the capacitor Cs (or the gate of the transistor M5). Here, by reading the potential of the wiring BIL, a potential retained in the first terminal of the capacitor Cs (or the gate of the transistor M5) can be read. That is, information written in the memory cell can be read on the basis of the potential retained in the first terminal of the capacitor Cs (or the gate of the transistor M5). Alternatively, existence or absence of information written to this memory cell can be found.

Note that also in the memory cell 321aD, an OS transistor is preferably used as the transistor M11. The 3Tr1C-type memory cell 321aD using an OS transistor as the transistor M11 is one embodiment of the above-described NOSRAIVI. The circuit configuration of the memory cell can be changed as appropriate.

<Structure 3 of Imaging Device>

Next, a stacked-layer structure of the imaging device illustrated in FIG. 10A is described with reference to a cross-sectional view.

Figure 12:
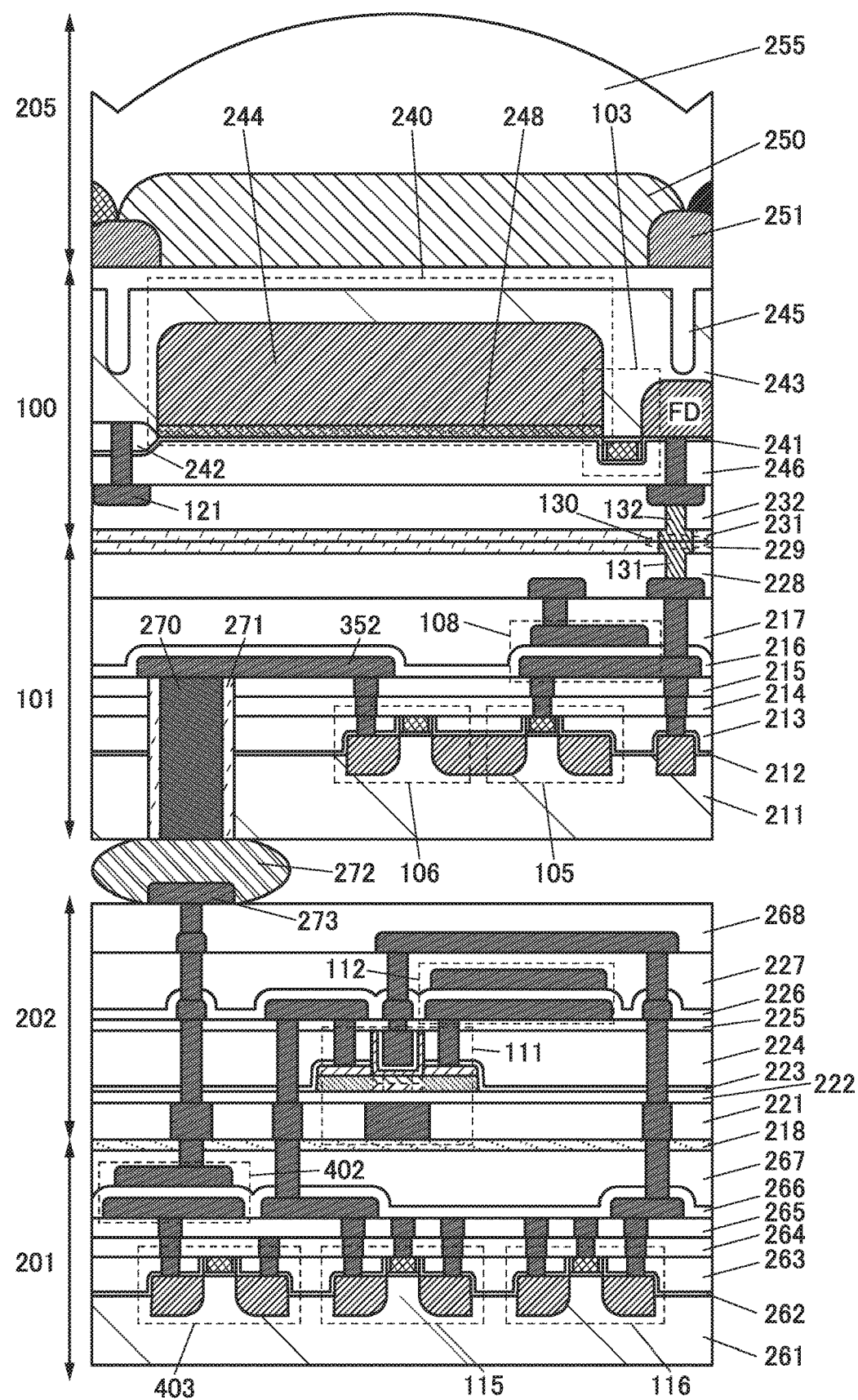
FIG. 12 is a cross-sectional view illustrating a pixel of one embodiment of the present invention.

FIG. 12 is an example of a cross-sectional view of a stacked-layer structure in which the element layer 201, the element layer 202, the element layer 101, the element layer 100, and the element layer 205 are stacked in this order. The element layer 202 is formed over the element layer 201 by a deposition process, and is bonded to the element layer 101 by bump bonding.

Note that the element layers 201, 101, 100, and 205 other than the element layer 202 have substantially the same structures as those illustrated in FIG. 9; thus, the description of FIG. 9 and the like can be referred to for details. Note that the element layer 201 includes the row driver 312 and the column driver 313 in FIG. 12, and thus part of the structure is different from that in FIG. 9. For example, a transistor 116 included in the row driver 312 is included in the element layer 201 in FIG. 12. The transistor 116 has a structure similar to that of the transistor 115.

In addition, in the element layer 201, the insulating layer 218 is provided over the insulating layer 267. The insulating layer 218 functions as a blocking film. The blocking film is preferably a film that has a function of preventing diffusion of hydrogen.

In a Si device, hydrogen is necessary to terminate dangling bonds; however, hydrogen in the vicinity of an OS transistor is one factor of generating carriers in the oxide semiconductor layer, which leads to a decrease in reliability. Therefore, a hydrogen blocking film is preferably provided between a layer in which the Si device is formed and a layer in which the OS transistor is formed.

The blocking film can be formed using, for example, silicon nitride, silicon nitride oxide, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

The configuration of the element layer 202 is described in detail below.

<Element Layer 202>

The element layer 202 is formed over the element layer 201. The element layer 202 includes the memory circuit 321 including an OS transistor. Here, a transistor 111 and a capacitor 112 included in the memory cell 321a are illustrated as part of the memory circuit 321.

In the element layer 202, an insulating layer 221, an insulating layer 222, an insulating layer 223, an insulating layer 224, an insulating layer 225, an insulating layer 226, an insulating layer 227, and an insulating layer 268 are provided. The conductive layer 273 is provided over the insulating layer 268.

The insulating layers 221, 224, 227, and 268 each function as an interlayer insulating film and a planarization film. The insulating layer 222 functions as a gate insulating film. As the gate insulating film, a silicon oxide film or the like can be used. The insulating layer 223 functions as a protective film. The insulating layer 225 functions as a blocking film. The insulating layer 226 functions as a dielectric layer of the capacitor.

The conductive layer 273 is electrically connected to the other electrode of the capacitor 402 in the element layer 201, and is electrically connected to the conductive layer 270 through the bump 272 as in FIG. 9. One of a source and a drain of the transistor 111 is electrically connected to one of a source and a drain of the transistor 115 in the element layer 201. A gate of the transistor 111 is electrically connected to one of a source and a drain of the transistor 116 in the element layer 201. The other of the source and the drain of the transistor 111 is electrically connected to one electrode of the capacitor 112.

Figure 13A:
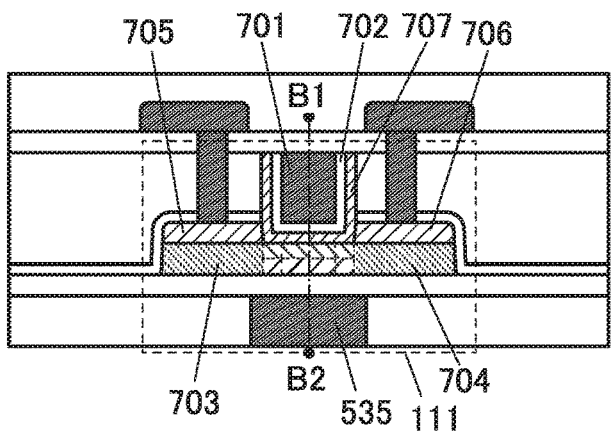
FIGS. 13A to 13D illustrate OS transistors of one embodiment of the present invention.

The details of the transistor 111 is shown in FIG. 13A. The transistor 111 illustrated in FIG. 13A has a self-aligned structure in which an insulating layer is provided over a stacked layer of an oxide semiconductor layer and a conductive layer and an opening reaching the oxide semiconductor layer is provided, so that the source electrode 705 and the drain electrode 706 are formed.

The transistor 111 can include a channel formation region, a source region 703, and a drain region 704, which are formed in the oxide semiconductor layer, a gate electrode 701, and a gate insulating film 702. At least the gate insulating film 702 and the gate electrode 701 are provided in the opening. The opening may further be provided with an oxide semiconductor layer 707.

Figure 13B:
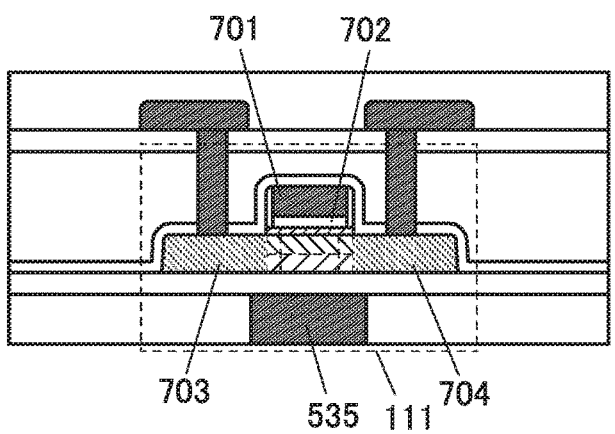

As illustrated in FIG. 13B, the transistor 111 may have a self-aligned structure in which the source region 703 and the drain region 704 are included in a semiconductor layer with the gate electrode 701 as a mask.

Figure 13C:
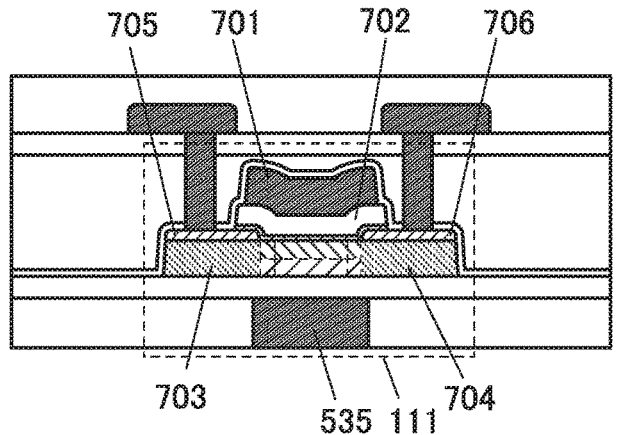

As illustrated in FIG. 13C, the transistor 111 may be a non-self-aligned top-gate transistor including a region where the source electrode 705 or the drain electrode 706 and the gate electrode 701 overlap with each other.

Figure 13D:
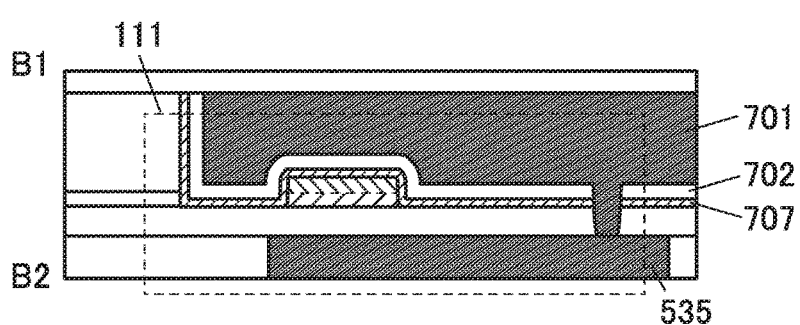

Although a structure in which the transistor 111 includes a back gate 535 is shown, a structure without a back gate may be employed. As illustrated in the cross-sectional view of the transistor 111 in the channel width direction in FIG. 13D, the back gate 535 may be electrically connected to a front gate of the transistor 111 that is provided to face the back gate 535. Note that FIG. 13D is a cross-sectional view taken along dashed-dotted line B1-B2 in FIG. 13A. Here, as the cross-sectional view in the channel width direction, the transistor in FIG. 13A is shown as an example; however, the same applies to a transistor having any of the other structures. The back gate 535 may be supplied with a fixed potential that is different from that supplied to the front gate.

As a semiconductor material used for an OS transistor, a metal oxide whose energy gap is greater than or equal to 2 eV, preferably greater than or equal to 2.5 eV, more preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that is required to have high reliability, and the like. A CAC-OS has high mobility and is suitable for a transistor that operates at high speed, and the like.

In the OS transistor, the semiconductor layer has a large energy gap, and thus the OS transistor has an extremely low off-state current of several yA/µm (current per micrometer of a channel width). An OS transistor has the following feature different from that of a Si transistor: impact ionization, an avalanche breakdown, a short-channel effect, or the like does not occur. Thus, the use of an OS transistor enables formation of a circuit having high withstand voltage and high reliability. Moreover, variations in electrical characteristics due to crystallinity unevenness, which are caused in Si transistors, are less likely to occur in OS transistors.

A semiconductor layer in an OS transistor can be, for example, a film represented by an In-M-Zn-based oxide that contains indium, zinc, and M (one or more metals selected from aluminum, titanium, gallium, germanium, yttrium, zirconium, lanthanum, cerium, tin, neodymium, and hafnium). The In-M-Zn-based oxide can be typically formed by a sputtering method. Alternatively, the In-M-Zn-based oxide can be formed by an atomic layer deposition (ALD) method.

It is preferable that the atomic ratio of metal elements of a sputtering target used for forming the In-M-Zn-based oxide by a sputtering method satisfy In M and Zn M. The atomic ratio between metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio between metal elements in the formed semiconductor layer may vary from the above atomic ratio between metal elements in the sputtering target in a range of ±40%.

An oxide semiconductor with low carrier density is used for the semiconductor layer. For example, the semiconductor layer may use an oxide semiconductor whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low density of defect states and can thus be regarded as having stable characteristics.

Note that, examples of a material for the semiconductor layer are not limited to those described above, and a material with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When the oxide semiconductor in the semiconductor layer contains silicon or carbon, which is an element belonging to Group 14, the amount of oxygen vacancies is increased in the semiconductor layer, and the semiconductor layer becomes n-type. Thus, the concentration of silicon or carbon (measured by secondary ion mass spectrometry) in the semiconductor layer is set to $2 \times 10^{18}$ atoms/cm$^3$ or lower, preferably $2 \times 10^{17}$ atoms/cm$^3$ or lower.

An alkali metal and an alkaline earth metal might generate carriers when bonded to an oxide semiconductor, in which case the off-state current of the transistor might be increased. Therefore, the concentration of alkali metal or alkaline earth metal in the semiconductor layer (measured by secondary ion mass spectrometry) is set to $1 \times 10^{18}$ atoms/cm$^3$ or lower, preferably $2 \times 10^{16}$ atoms/cm$^3$ or lower.

When the oxide semiconductor in the semiconductor layer contains nitrogen, electrons functioning as carriers are generated and the carrier density increases, so that the semiconductor layer easily becomes n-type. Thus, a transistor using an oxide semiconductor that contains nitrogen is likely to be normally on. Hence, the concentration of nitrogen in the semiconductor layer (measured by secondary ion mass spectrometry) is preferably set to $5 \times 10^{18}$ atoms/cm$^3$ or lower.

Specifically, when hydrogen is contained in an oxide semiconductor included in the semiconductor layer, hydrogen reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is measured by secondary ion mass spectrometry (SIMS), is lower than $1 \times 10^{20}$ atoms/cm$^3$, preferably lower than $1 \times 10^{19}$ atoms/cm$^3$, more preferably lower than $5 \times 10^{18}$ atoms/cm$^3$, still more preferably lower than $1 \times 10^{18}$ atoms/cm$^3$. When an oxide semiconductor with a sufficiently low concentration of impurities such as hydrogen is used for a channel formation region of a transistor, the transistor can have stable electrical characteristics.

The semiconductor layer may have a non-single-crystal structure, for example. Examples of a non-single-crystal structure include a c-axis aligned crystalline oxide semiconductor (CAAC-OS) including a c-axis aligned crystal, a polycrystalline structure, a microcrystalline structure, and an amorphous structure. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

The composition of a cloud-aligned composite oxide semiconductor (CAC-OS), which is one embodiment of a non-single-crystal semiconductor layer, is described below.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor with a composition in which a region containing GaO$_{X3}$ as a main component and a region containing In$_{X2}$Zn$_{Y2}$O$_{Z2}$ or InO$_{X1}$ as a main component are mixed. Note that in this specification, when the atomic ratio of In to an element M in a first region is greater than the atomic ratio of In to an element M in a second region, for example, the first region is described as having higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions containing the selected metal element(s) as a main component(s) are observed in part of the CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the XRD measurement that there are no alignment in the a-b plane direction and no alignment in the c-axis direction in the measured areas.

In an electron diffraction pattern of the CAC-OS that is obtained by irradiation with an electron beam with a probe diameter of 1 nm (also referred to as a nanometer-sized electron beam), a ring-like region (ring region) with high luminance and a plurality of bright spots in the ring region are observed. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the region containing $GaO_{X3}$ as a main component and the region containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the region containing $In_{X2}Zn_{Y2}O_{Z2}$ or $InO_{X1}$ as a main component, the conductivity of an oxide semiconductor is generated. Accordingly, when the region containing $In_{X2}Zn_{Y2}O_{Z2}$ or $InO_{X1}$ as a main component are distributed like a cloud in an oxide semiconductor, high field-effect mobility (μ) can be achieved.

By contrast, the insulating property of the region containing $GaO_{X3}$ or the like as a main component is superior to that of the region containing $In_{X2}Zn_{Y2}O_{Z2}$ or $InO_{X1}$ as a main component. In other words, when the region containing $GaO_{X3}$ or the like as a main component is distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element using a CAC-OS has high reliability. Thus, the CAC-OS is suitably used as a material in a variety of semiconductor devices.

Note that although this modification example shows the structure in which the reading circuit of the pixel circuit and the driver circuit of the memory circuit are provided in the element layer 201 and the memory circuit is provided in the element layer 202, the present invention is not limited thereto. For example, a driver circuit for a pixel circuit, a neural network, a communication circuit, a CPU, or the like may be provided in the element layer 201 or the element layer 202.

A normally-off CPU (also referred to as "Noff CPU") can be formed using an OS transistor and a Si transistor. Note that the Noff CPU is an integrated circuit including a normally-off transistor, which is in a non-conduction state (also referred to as an off state) even when a gate voltage is 0 V.

In the Noff CPU, power supply to a circuit that does not need to operate can be stopped so that the circuit can be brought into a standby state. The circuit brought into the standby state because of the stop of power supply does not consume power. Thus, the power usage of the Noff CPU can be minimized. Moreover, the Noff CPU can retain data necessary for operation, such as setting conditions, for a long time even when power supply is stopped. The return from the standby state requires only restart of power supply to the circuit and does not require rewiring of setting conditions or the like. In other words, high-speed return from the standby state is possible. As described here, the power consumption of the Noff CPU can be reduced without a significant decrease in operation speed.

In the above-described manner, according to one embodiment of the present invention, an imaging device having high sensitivity can be provided. Alternatively, according to one embodiment of the present invention, an imaging device having high resolution can be provided. Alternatively, according to one embodiment of the present invention, a high-performance imaging device can be provided. Alternatively, according to one embodiment of the present invention, a small imaging device can be provided. Alternatively, according to one embodiment of the present invention, an imaging device capable of high-speed operation can be provided.

The structure described in this embodiment can be combined with any of the other structures described in this embodiment or the like, or a structure described in the other embodiments as appropriate.

Embodiment 2

Examples of a package and a camera module in each of which an image sensor chip is placed are described in this embodiment. For the image sensor chip, the structure of the imaging device of one embodiment of the present invention can be used.

FIG. 14A1 is an external perspective view of the top surface side of a package in which an image sensor chip is placed. The package includes a package substrate 610 to which an image sensor chip 650 is fixed, a cover glass 620, an adhesive 630 for bonding them, and the like.

FIG. 14A2 is an external perspective view of the bottom surface side of the package. A ball grid array (BGA) in which solder balls are used as bumps 640 on the bottom surface of the package is employed. Note that, without being limited to the BGA, a land grid array (LGA), a pin grid array (PGA), or the like may be employed.

FIG. 14A3 is a perspective view of the package, in which parts of the cover glass 620 and the adhesive 630 are not illustrated. Electrode pads 660 are formed over the package substrate 610, and the electrode pads 660 and the bumps 640 are electrically connected to each other via through-holes. The electrode pads 660 are electrically connected to the image sensor chip 650 through wires 670.

FIG. 14B1 is an external perspective view of the top surface side of a camera module in which an image sensor chip is placed in a package with a built-in lens. The camera module includes a package substrate 611 to which an image sensor chip 651 is fixed, a lens cover 621, a lens 635, and the like. Furthermore, an IC chip 690 having a function of a driver circuit, a signal conversion circuit, or the like of an imaging device is provided between the package substrate 611 and the image sensor chip 651; thus, the structure as a system in package (SiP) is formed.

FIG. 14B2 is an external perspective view of the bottom surface side of the camera module. A quad flat no-lead package (QFN) structure in which lands 641 for mounting are provided on the bottom surface and side surfaces of the package substrate 611 is employed. Note that this structure is only an example, and a quad flat package (QFP) or the above-mentioned BGA may also be provided.

FIG. 14B3 is a perspective view of the module, in which parts of the lens cover 621 and the lens 635 are not illustrated. The lands 641 are electrically connected to electrode pads 661, and the electrode pads 661 are electrically connected to the image sensor chip 651 or the IC chip 690 through wires 671.

The image sensor chip placed in a package having the above form can be easily mounted on a printed substrate or the like, and the image sensor chip can be incorporated into a variety of semiconductor devices and electronic devices.

This embodiment can be combined with any of the other embodiments as appropriate.

Embodiment 3

Examples of an electronic device that can use the imaging device of one embodiment of the present invention include display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 15A to 15F each illustrate specific examples of these electronic devices.

Figure 15A:
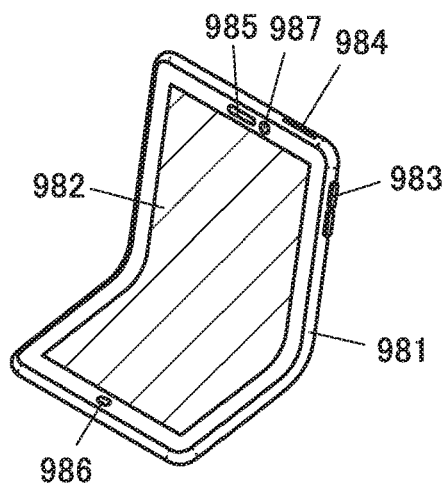
FIGS. 15A to 15F illustrate electronic devices of one embodiment of the present invention.

FIG. 15A shows an example of a mobile phone that includes a housing 981, a display portion 982, an operation button 983, an external connection port 984, a speaker 985, a microphone 986, a camera 987, and the like. The display portion 982 of the mobile phone includes a touch sensor. All operations including making a call and inputting text can be performed by touch on the display portion 982 with a finger, a stylus, or the like. The imaging device of one embodiment of the present invention and the operation method of the imaging device can be used for obtaining an image in the mobile phone.

Figure 15B:
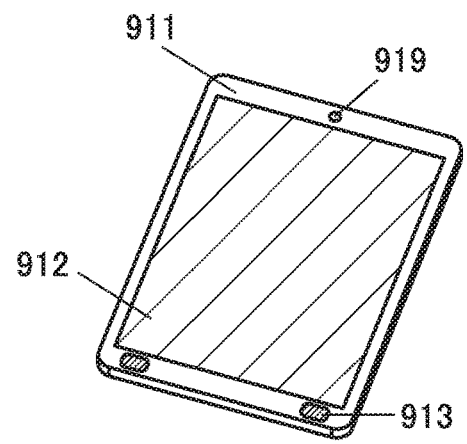

FIG. 15B illustrates a portable information terminal, which includes a housing 911, a display portion 912, speakers 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention and the operation method of the imaging device can be used for obtaining an image in the portable data terminal.

Figure 15C:
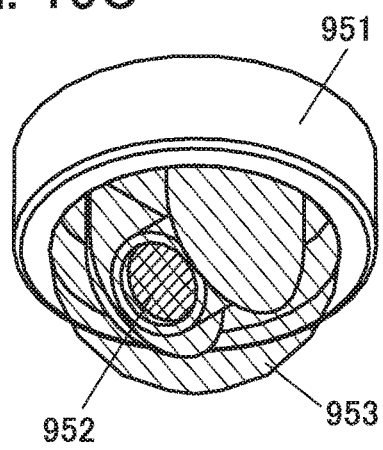

FIG. 15C is a surveillance camera, which includes a support base 951, a camera unit 952, a protection cover 953, and the like. The camera unit 952 is provided with a rotation mechanism and the like and can capture an image of all of the surroundings when provided on a ceiling. The imaging device of one embodiment of the present invention and the operation method of the imaging device can be used for obtaining an image in the camera unit. Note that a surveillance camera is a name in common use and does not limit the use thereof. For example, a device that has a function of a surveillance camera can also be called a camera or a video camera.

Figure 15D:
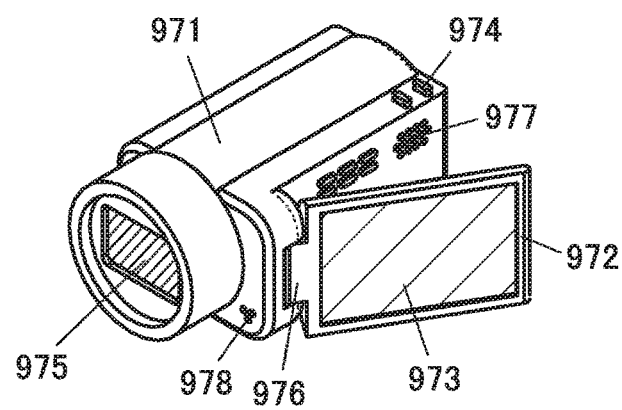

FIG. 15D illustrates a video camera, which includes a first housing 971, a second housing 972, a display portion 973, operation keys 974, a lens 975, a joint 976, a speaker 977, a microphone 978, and the like. The operation keys 974 and the lens 975 are provided for the first housing 971, and the display portion 973 is provided for the second housing 972. The imaging device of one embodiment of the present invention and the operation method of the imaging device can be used for obtaining an image in the video camera.

Figure 15E:
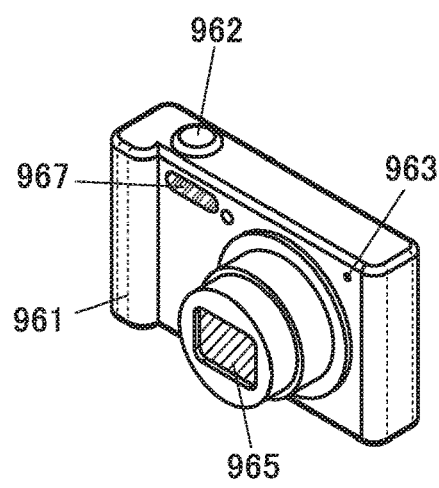

FIG. 15E illustrates a digital camera, which includes a housing 961, a shutter button 962, a microphone 963, a light-emitting portion 967, a lens 965, and the like. The imaging device of one embodiment of the present invention and the operation method of the imaging device can be used for obtaining an image in the digital camera.

Figure 15F:
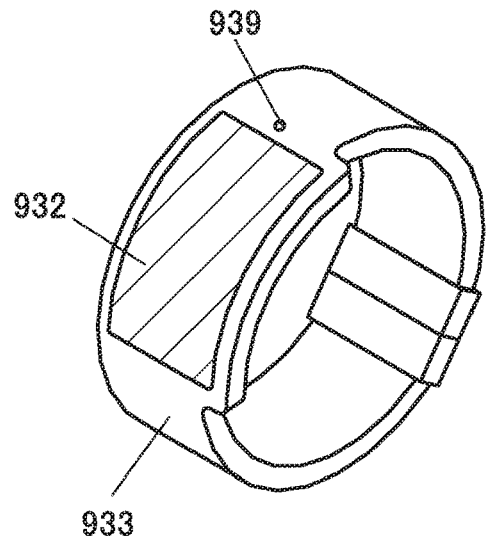

FIG. 15F illustrates a wrist-watch-type information terminal, which includes a display portion 932, a housing 933 also serving as a wristband, a camera 939, and the like. The display portion 932 is provided with a touch panel for operating the information terminal. The display portion 932 and the housing 933 also serving as a wristband have flexibility and fit a body well. The imaging device of one embodiment of the present invention and the operation method of the imaging device can be used for obtaining an image in the information terminal.

This embodiment can be combined with any of the other embodiments as appropriate.

This application is based on Japanese Patent Application Serial No. 2019-146340 filed with Japan Patent Office on Aug. 8, 2019, the entire contents of which are hereby incorporated by reference.

What is claimed is:

1. An imaging device comprising a first semiconductor substrate and a second semiconductor substrate,
wherein the first semiconductor substrate includes a photoelectric conversion device and a first transistor,
wherein the second semiconductor substrate includes a second transistor, a third transistor, and a fourth transistor,
wherein one electrode of the photoelectric conversion device is electrically connected to one of a source and a drain of the first transistor,
wherein the other of the source and the drain of the first transistor is electrically connected to one of a source and a drain of the second transistor,
wherein the one of the source and the drain of the second transistor is electrically connected to a gate of the third transistor,
wherein one of a source and a drain of the third transistor is electrically connected to one of a source and a drain of the fourth transistor,
wherein the photoelectric conversion device and at least parts of the second transistor, the third transistor, and the fourth transistor overlap with each other,
wherein a third semiconductor substrate is positioned at a side of a surface of the second semiconductor substrate where the second to fourth transistors are not formed,
wherein a fifth transistor is formed on the third semiconductor substrate, and
wherein the fifth transistor is electrically connected to the other of the source and the drain of the fourth transistor through a first capacitor.

2. The imaging device according to claim 1,
wherein a first insulating layer and a first conductive layer are positioned at a side of a surface of the first semiconductor substrate where the first transistor is formed,
wherein the first conductive layer includes a region embedded in the first insulating layer and is electrically connected to the other of the source and the drain of the first transistor,
wherein a second insulating layer and a second conductive layer are positioned at a side of a surface of the second semiconductor substrate where the second to fourth transistors are formed,
wherein the second conductive layer includes a region embedded in the second insulating layer and is electrically connected to the gate of the third transistor,
wherein the first conductive layer and the second conductive layer are directly bonded to each other, and
wherein the first insulating layer and the second insulating layer are directly bonded to each other.

3. The imaging device according to claim 2,
wherein the first semiconductor substrate and the second semiconductor substrate are silicon substrates.

4. The imaging device according to claim 3,
wherein the first semiconductor substrate includes an element imparting p-type conductivity, and
wherein regions functioning as the one electrode of the photoelectric conversion device and the source and the drain of the first transistor include elements imparting n-type conductivity.

5. The imaging device according to claim 4,
wherein the one electrode of the photoelectric conversion device and the one of the source and the drain of the first transistor are formed in the same region.

6. The imaging device according to claim 2,
wherein a second capacitor is positioned between the second semiconductor substrate and the second insulating layer, and
wherein one electrode of the second capacitor is electrically connected to the gate of the third transistor.

7. The imaging device according to claim 1,
wherein a memory circuit is positioned between the second semiconductor substrate and the third semiconductor substrate, and
wherein the memory circuit includes a transistor including a metal oxide in a channel formation region.

8. The imaging device according to claim 7,
wherein the metal oxide includes In, Zn, and M, and
wherein M is one or more of Al, Ti, Ga, Ge, Sn, Y, Zr, La, Ce, Nd, and Hf.

9. An electronic device comprising:
the imaging device according to claim 1, and
a display device.

* * * * *